United States Patent
Koganei et al.

[11] Patent Number: 6,055,179
[45] Date of Patent: Apr. 25, 2000

[54] MEMORY DEVICE UTILIZING GIANT MAGNETORESISTANCE EFFECT

[76] Inventors: Akio Koganei; Naoki Nishimura, both of c/o Canon Kabushiki Kaisha 30-2, Shimomaruko 3-chome, Ohta-ku, Tokyo, Japan

[21] Appl. No.: 09/312,845

[22] Filed: May 17, 1999

[30] Foreign Application Priority Data

| May 19, 1998 | [JP] | Japan | 10-136871 |
| Jan. 14, 1999 | [JP] | Japan | 11-007916 |
| Feb. 17, 1999 | [JP] | Japan | 11-038610 |
| Apr. 9, 1999 | [JP] | Japan | 11-102957 |
| Apr. 16, 1999 | [JP] | Japan | 11-109573 |

[51] Int. Cl.[7] ............................ G11C 11/00; G11C 11/14; G11C 11/15
[52] U.S. Cl. ......................... 365/158; 365/171; 365/173
[58] Field of Search .................................. 365/158, 171, 365/173, 157; 360/113, 119

[56] References Cited

U.S. PATENT DOCUMENTS

| 5,173,873 | 12/1992 | Wu et al. | 365/173 |
| 5,343,422 | 8/1994 | Kung et al. | 365/173 |
| 5,432,734 | 7/1995 | Kawano et al. | 365/158 |
| 5,587,943 | 12/1996 | Torok et al. | 365/158 |
| 5,841,611 | 11/1998 | Sakakima et al. | 360/113 |

*Primary Examiner*—Son Mai

[57] ABSTRACT

A memory device using giant magnetoresistance (GMR) effect, and an inexpensive memory device that has low power consumption, excels in memory performance, and is suitable for use in computer peripherals.

The memory device utilizes giant magnetoresistance effect and includes a substrate with an insulating surface; a monocrystalline semiconductor layer formed on the insulating surface of the substrate, a switching element formed at least on part of the monocrystalline semiconductor layer, a magnetoresistive film formed on the insulating surface of the substrate, the magnetoresistive film comprising a first magnetic layer and a second magnetic layer which has a higher coercive force than the first magnetic layer and which is stacked on the first magnetic layer with a non-magnetic layer interposed between them, and a word line installed near the magnetoresistive film with an insulating layer interposed between them, and the switching element is connected electrically to either the magnetoresistive film or word line.

32 Claims, 16 Drawing Sheets

MEMORY DEVICE UTILIZING GIANT MAGNETORESISTANCE EFFECT

BACKGROUND OF THE INVENTION

1. Field of the Invention

The present invention relates to a memory device that uses giant magnetoresistance (GMR) effect, and more particularly to an inexpensive memory device that has low power consumption, excels in memory performance, and is suitable for use in computer peripherals.

2. Related Background Art

In the field of memory devices used for computers and electronic equipment, technology is advancing constantly, being driven by keen competition for development. Amid various new memory devices being proposed, a giant magnetoresistance (GMR) effect has been discovered recently in relation to a magnetoresistive film consisting of a non-magnetic layer sandwiched between ferromagnetic layers. Consequently, magnetic sensors, memory devices, etc. by the use of this phenomena are attracting attention. The present invention relates to a memory device employing this giant magnetoresistance (GMR) effect, which hereinafter will be referred to as a GMR memory device.

The basic structure of the GMR memory device comprises a non-magnetic layer sandwiched between two ferromagnetic layers that have different coercive forces at room temperature. Information is written into the GMR memory device as the magnetization directions of the ferromagnetic layers are switched by the application of an external magnetic field. In other words, information is stored as directions of magnetic fields which represent "0" and "1".

To read out stored information, the magnetization direction of only the magnetic layer with weaker coercive force is reversed by the application of an ac magnetic field weaker than that during writing, while a current is supplied to the magnetoresistive film, and the difference in the resistance value before and after the reversal of magnetization is used for reading the information. This makes use of the fact that the resistance value differs between the state in which the magnetizations of the two magnetic layers are oriented in the same direction (parallel state) and the state in which the magnetizations of the two magnetic layers are oriented in the opposite direction (anti-parallel state).

Advantageously, GMR memory devices such as the one described above have good radiation resistance, are non-volatile in principle, are rewritable, and are not limited with respect to the number of rewrites since information is stored magnetically. Also, they can read and write information at high speed. Furthermore, they are capable of high-density data storage if downsized by means of existing semiconductor technologies and are expected to replace dynamic random access memory (DRAM) in the future. Such a GMR memory device is described, for example, in Japanese Patent Application Laid-Open No. 6-243673.

The operating principle of a GMR memory device will be described in detail below. FIG. 1 is a schematic sectional view showing the basic structure of the GMR memory device. In FIG. 1, 101 represents the first magnetic layer, 102 the non-magnetic layer, 103 the second magnetic layer, 104 an insulating layer, and 105 a word line (writing ray). These layers are stacked on a substrate (not shown) in sequence.

The first magnetic layer 101 is made of a soft magnetic material and the second magnetic layer 103 is made of a hard magnetic material. Soft and hard magnetic materials are distinguished from each other by the intensity of coercive force. The magnetic material with a high coercive force is called hard magnetic material and the magnetic material with a low coercive force is called soft magnetic material. Thus, in FIG. 1, the second magnetic layer 103 has higher coercive force than the first magnetic layer 101 at room temperature.

Functionally, the second magnetic layer 103 holds written information while the first magnetic layer 101 acts to vary the resistance value through reversal of magnetization during reading. Therefore, the first magnetic layer 101 can also be called a reproducing layer, and the second magnetic layer 103 can be called a memory layer.

To write information into the GMR memory device of FIG. 1, the magnetization direction of the second magnetic layer 103 (which is a memory layer) is varied by means of the magnetic field generated by the passage of electric current through the word line 105. This will be explained with reference to FIGS. 2A and 2B. In these figures, the same parts as those in FIG. 1 are designated by the same reference numbers and detailed descriptions thereof are omitted.

FIG. 2A shows a case where "0" is written into the GMR memory device. When an electric current is passed through the word line 105 perpendicularly out of the drawing, a magnetic field is generated in the direction of the arrow 106-1. Since a large magnetic field is applied during writing, not only the magnetization of the first magnetic layer 101 (the reproducing layer) but also the magnetization of the second magnetic layer 103 is directed from left to right. Thus, FIG. 2A represents a state of "0".

FIG. 2B shows a case where "1" is written into the GMR memory device. When an electric current is passed through the word line 105 perpendicularly into the drawing, a magnetic field is generated in the direction of the arrow 106-2. The magnetization of both the first magnetic layer 101 and the second magnetic layer 103 is directed from right to left. Thus, FIG. 2A represents a state of "1".

The information written in this way can be read out via passage of an electric current weaker than that during writing through the word line 105 in alternating directions. In other words, the magnetization of the first magnetic layer 101 or the reproducing layer is reversed by alternate passage of positive and negative regenerative current pulses through the word line 105 while an electric current is passed through the magnetoresistive film consisting of the first magnetic layer 101, non-magnetic layer 102, and second magnetic layer 103, and the variation in the resistance value of the magnetoresistive film is detected to reproduce the written information.

The principle of the above-mentioned information reproduction will be explained with reference to FIGS. 3A, 3B, 4A, and 4B. In these figures, the same parts as those in FIG. 1 are designated by the same reference numbers and detailed descriptions thereof are omitted.

First, description will be given of the case where "0" is stored as shown in FIG. 2A. First a current is passed through the word line 105 perpendicularly into the drawing as shown in FIG. 3A, then a current is passed perpendicularly out of the drawing as shown in FIG. 4A. When the current is passed perpendicularly into the drawing, the magnetic field indicated by the arrow 107 is generated. Since this magnetic field is weaker than that during writing, the magnetization of the first magnetic layer 101 changes its direction to the left as shown in FIG. 3A, but the magnetization of the second magnetic layer 103 remains directed to the right.

Then when the current is passed perpendicularly into the drawing, the magnetic field indicated by the arrow 108 is generated and the magnetization of the first magnetic layer 101 is directed to the right as shown in FIG. 4A.

Now paying attention to the magnetization directions of the two magnetic layers, first the magnetization directions of the first magnetic layer 101 and second magnetic layer 103 are anti-parallel in the state shown in FIG. 3A, then the magnetization directions of the first magnetic layer 101 and second magnetic layer 103 become parallel in the state shown in FIG. 4A. A magnetoresistive film displays a large resistance value when the magnetization directions of two magnetic layers are anti-parallel, and it displays a small resistance value when the magnetization directions of two magnetic layers are parallel. Therefore, if the resistance value changes from large to small when positive and negative regenerative current pulses are passed through the word line 105 as described above, it is seen that "0" is written into memory.

The variation in the resistance value described above can be detected through the variation in the current value when regenerative current pulses are passed through the word line 105 with an equal voltage applied to the magnetoresistive film. Therefore, if the current changes from small to large when positive and negative regenerative current pulses are passed through the word line 105 as described above, it is seen that "0" is written into memory.

Now description will be given of the case where "1" is stored as shown in FIG. 2B. First a current is passed through the word line 105 perpendicularly into the drawing as shown in FIG. 3B, then a current is passed perpendicularly out of the drawing as shown in FIG. 4B. When the current is passed perpendicularly into the drawing, the magnetic field indicated by the arrow 107 is generated, but the magnetization directions of the first magnetic layer 101 and the second magnetic layer 103 remain directed to the left.

Then when the current is passed perpendicularly out of the drawing, the magnetic field indicated by the arrow 108 is generated and the magnetization of the first magnetic layer 101 changes its direction to the right as shown in FIG. 4B.

Now paying attention to the magnetization directions of the two magnetic layers, first the magnetization directions of the first magnetic layer 101 and second magnetic layer 103 are parallel in the state shown in FIG. 3B, then the magnetization directions of the first magnetic layer 101 and second magnetic layer 103 become anti-parallel in the state shown in FIG. 4B. Therefore, if the resistance value changes from small to large when positive and negative regenerative current pulses are passed through the word line 105 as described above, it is seen that "1" is written into memory. In other words, if the current changes from large to small when a fixed voltage is applied to a magnetoresistive film and positive and negative regenerative current pulses are passed through the word line 105 as described above, it is seen that the information written is "1".

As described above, a GMR memory device can record information by passing write currents of different polarities according to the information to be written into the word line. By passing weaker positive and negative regenerative current pulses through the word line than the write current, it is also possible to determine from changes in the resistance value whether recorded information is "0" or "1". Such a recording/reproducing method will provide ideal memory performance because of its non-volatile and non-destructive nature and high-speed driving capability.

Generally GMR elements are formed on an insulator to prevent current leakage from the GMR memory device during recording and reproduction. Japanese Patent Application Laid-Open No. 9-45074 discloses an example of a so-called SOI (silicon on insulator) substrate where a monocrystalline silicon film is formed on a substrate with an insulating surface. A schematic sectional view of such a GMR memory device is shown in FIG. 5.

In FIG. 5, 206 represents a silicon substrate, 207; an insulating layer, 208; an epitaxially grown monocrystalline silicon layer, 209; a buffer layer made of Cu, 201 a first magnetic layer, 202; a non-magnetic layer, 203; a second magnetic layer having a higher coercive force than the first magnetic layer at room temperature, 204 an insulating layer, and 205 a word line (writing ray). Here the silicon substrate 206, insulating layer 207, and monocrystalline silicon layer 208 forms an SOI substrate. With the GMR memory device of FIG. 5, information is written and read in a manner similar to that described with reference to FIGS. 1 through 4A and 4B.

The GMR memory device shown in FIG. 5 can prevent current leakage to the silicon substrate 206 by means of the insulating layer 207. Epitaxial growth of first magnetic layer 201, non-magnetic layer 202, and second magnetic layer 203 on the SOI substrate in the device shown in FIG. 5 provides a highly reliable and easy-to-write memory device capable of large variations in the magnetoresistive value using small magnetic fields.

In the GMR memory device disclosed in Japanese Patent Application Laid-Open No. 9-45074, however, used is the SOI substrate merely as the base material for forming magnetoresistive films and did not fully capitalized on the characteristics of the SOI substrate.

SUMMARY OF THE INVENTION

The object of this invention is to solve the above-mentioned problem with the prior art and provide a high-density GMR memory device where the switching elements for operating the memory device are integrated monolithically with the magnetoresistive film by making full use of the characteristics of the SOI substrate.

The above-mentioned object is attained by means of a memory device utilizing giant magnetoresistance effect and comprising:

a substrate with an insulating surface, a monocrystalline semiconductor layer formed on the insulating surface of said substrate, a switching element formed at least on part of the monocrystalline semiconductor layer, a magnetoresistive film formed on the insulating surface of the substrate, the magnetoresistive film consisting of a first magnetic layer and a second magnetic layer which has a higher coercive force than the first magnetic layer and which is stacked on the first magnetic layer with a non-magnetic layer interposed between them, and a word line installed near the magnetoresistive film with an insulating layer interposed between them, wherein the switching element is connected electrically to either the magnetoresistive film or word line.

DESCRIPTION OF THE PREFERRED EMBODIMENTS

Figure 6:
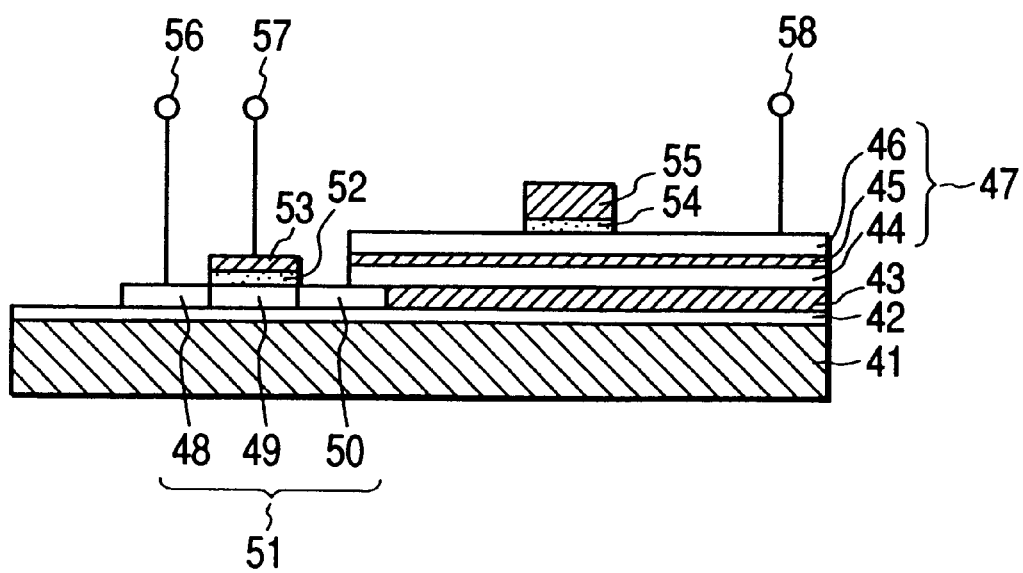
FIG. 6 is a schematic sectional view showing the first embodiment of the GMR memory device according to the present invention.

FIG. 6 is a schematic sectional view showing the first embodiment of the GMR memory device according to the present invention. The first embodiment comprises one memory cell for storing one bit of information and one switching element for switching the memory cell, representing the simplest configuration of the present invention.

In FIG. 6; 41, 42, and 43 represents a silicon substrate, an insulating layer made of $SiO_2$ and formed on the silicon substrate 41, and a monocrystalline silicon layer formed on the insulating layer 42, respectively. The silicon substrate 41, insulating layer 42, and monocrystalline silicon layer 43 form a so-called SOI substrate. The thickness of the insulating layer 42 is selected according to the configuration of the memory device to be created, but a thickness of 100 nm to 1 $\mu$m is desirable for sufficient insulating performance.

Such an SOI substrate is formed, for example, by epitaxially growing a monocrystalline silicon layer on a porous silicon layer, bonding the monocrystalline silicon layer onto another substrate with an insulating layer sandwiched between them, and then removing the porous silicon layer, as described in U.S. Pat. No. 5,371,037. Or any other known method may be used, including the method that involves implanting oxygen ions from the surface of a silicon substrate to a predetermined depth and then forming an insulating layer made of silicon oxide under the monocrystalline silicon layer by heat treatment, and the method as disclosed by U.S. Pat. No. 5,374,564 that involves implanting oxygen ions from the surface of a silicon substrate to a predetermined depth, forming a microbubble area under the monocrystalline silicon layer by heat treatment, bonding the monocrystalline silicon layer onto another substrate, and then separating the substrates in the microbubble area.

A source region 48, gate region 49, and drain region 50 are formed on part of the monocrystalline silicon layer 43. And a gate electrode 53 is installed on the gate region 49, separated by an insulating layer 52. And these components compose a field-effect transistor (FET) 51. This field-effect transistor 51 is fabricated by using known semiconductor processes. For example, the source region 48, gate region 49, and drain region 50 can be formed by a method of diffusing impurities into part of the monocrystalline silicon layer 43.

Figure 1:
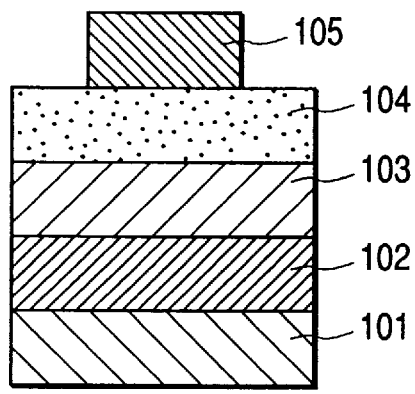
FIG. 1 is a schematic sectional view showing the basic structure of a conventional GMR memory device.

A magnetoresistive film 47 is formed on the monocrystalline silicon layer 43. This magnetoresistive film 47 is formed by stacking a first magnetic layer 44, non-magnetic layer 45, and second magnetic layer 46 on the monocrystalline silicon layer 43 in sequence. The second magnetic layer 46 has a higher coercive force than the first magnetic layer 44 at room temperature. In other words, the second magnetic layer 46 serves the function of the memory layer (write layer) described with reference to FIG. 1, and the first magnetic layer 44 serves the function of the reproducing layer (read layer). Both first magnetic layer 44 and second magnetic layer 46 are made of Ni, Fe, Co, or an alloy containing at least one of these elements. Through changes in the combination or composition of these elements, the second magnetic layer 46 is made to have a higher coercive force than the first magnetic layer 44. For example, materials such as Co, NiFe, NiFeCo, FeCo, and CoFeB are used to form these magnetic layers. Also, the first magnetic layer 44 or second magnetic layer 46 may consist of two or more layers. For example, a two-layered structure, a stack of a 5-nm thick Co layer and 30-nm thick FeMn layer, may be used for the second magnetic layer 46.

The first magnetic layer 44 and second magnetic layer 46 may be formed in the opposite order. That is, the layers may be stacked in this order: the second magnetic layer 46, non-magnetic layer 45, and the first magnetic layer 44 on the monocrystalline silicon layer 43. The thicknesses of the first magnetic layer 44 and second magnetic layer 46 are preferably within the range of 2 to 100 nm.

As for the material of the non-magnetic layer 45, metals such as Cu, Ag, Au, Al, and Mg should preferably be used, and most preferably Cu should be used. The thickness of the non-magnetic layer 45 is preferably within the range of 1 to 10 nm. Depending on the method of film formation, a film thinner than 1 nm will grow in an islandlike fashion, which may result in pinhole formation. In case of such pinhole formation, the interaction between the first and second magnetic layers may suppress MR ratio. On the other hand, if the non-magnetic layer 45 is thicker than 10 nm, the gap between the first and second magnetic layers becomes too large with respect to the mean free path of electrons. This will reduce spin-dependent scattering, which in turn will result in reduced MR ratio.

The drain region 50 of the above-mentioned field-effect transistor (FET) 51 is electrically connected to one end of the magnetoresistive film 47. This field-effect transistor 51 serves the function of the switching element to pass current through the magnetoresistive film 47. In view of this, the thickness of the monocrystalline silicon layer 43 on part of which the field-effect transistor 51 is formed is very important. Preferably, the thickness of the monocrystalline silicon layer 43 should be within 50 to 500 nm.

If the monocrystalline silicon layer 43 is thinner than 50 nm, lattice defects may develop, degrading the crystallinity, and thus adversely affecting the uniformity of the magnetoresistive film formed on this layer. Consequently, memory performance may be lowered or if ion implantation is used for fabrication of field-effect transistors, damage caused by the ion implantation may extend to the insulating layer 42, which in turn may result in inability to obtain desired semiconductor characteristics or may make operation of the field-effect transistors unstable. On the other hand, if the monocrystalline silicon layer 43 is thicker than 500 nm, power consumption may increase, resulting in a reduced switching speed, or leakage current flowing outside the magnetoresistive film may increase, reducing MR ratio, and thus failing to produce sufficient signal strength during reproduction. Furthermore, with the monocrystalline silicon layer 43 thicker than 500 nm, the ions introduced by the above-mentioned ion implantation may produce a concentration profile, causing unevenness in the operating characteristics of the field-effect transistor 51 formed on part of the monocrystalline silicon layer 43. Preferably the thickness of the monocrystalline silicon layer 43 should be within the range of 50 to 250 nm, and more preferably within the range of 60 to 120 nm.

A word line (writing ray) 55 is formed on the magnetoresistive film 47, separated by an insulating layer 54. To pass a write current, the word line 55 is made of a highly conductive material, desirably, a metal film such as Al, Cu, or Au. The film thickness of the word line 55, which depends on the magnitude of current and the line width, is preferably within the range of 10 to 1000 nm. The insulating layer 54 is formed of non-organic material such as $SiO_2$, SiN, or $Al_2O_3$, or organic material such as novolac resin. The thickness of the insulating layer 54, which depends on the withstand voltage necessary to withstand-the power applied to the word line 55, is normally within the range of 5 to 1000 nm.

Although not used in FIG. 6, a buffer layer may be provided between the monocrystalline silicon layer 43 and magnetoresistive film 47 to adjust the free surface energy between the two layers and achieve a highly flat interface structure. As a material for such a buffer layer, metals such as Ta, Cu, and Cr, or insulating materials such as SiN, $SiO_2$, or $Al_2O_3$ are used. More preferably Ta or SiN is used. The thickness of the buffer layer should preferably be within the range of 2 to 10 nm. Depending on the method of film formation, a film thinner than 2 nm will grow in an islandlike fashion, which may result in uneven film properties while a film thicker than 10 nm may cause lower productivity.

Figure 2A:
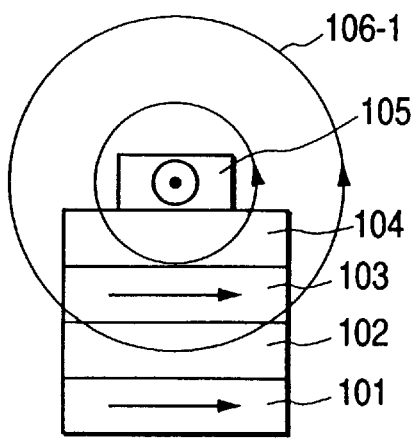
FIGS. 2A and 2B are schematic views explaining how to write information in a conventional GMR memory device.
Figure 2B:
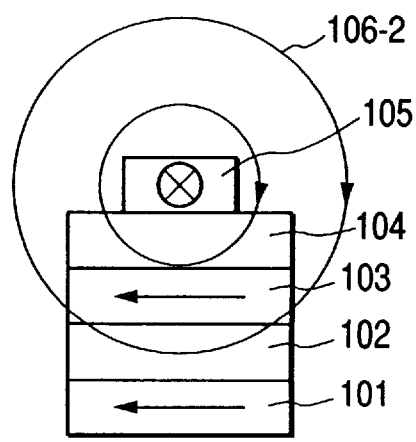
Figure 3A:
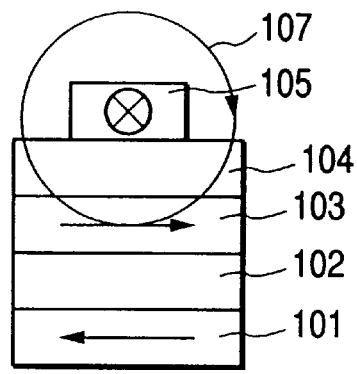
FIGS. 3A, 3B, 4A and 4B are schematic views explaining how to read information out of a conventional GMR memory device.
Figure 3B:
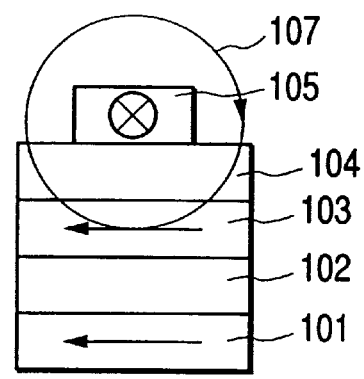
Figure 4A:
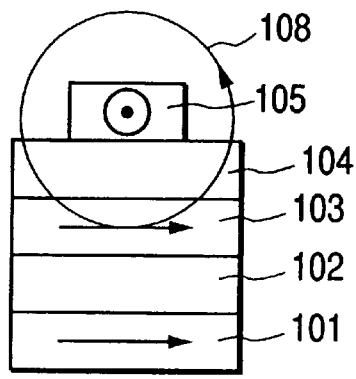
Figure 4B:
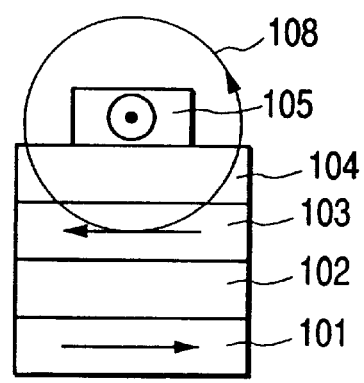
Figure 5:
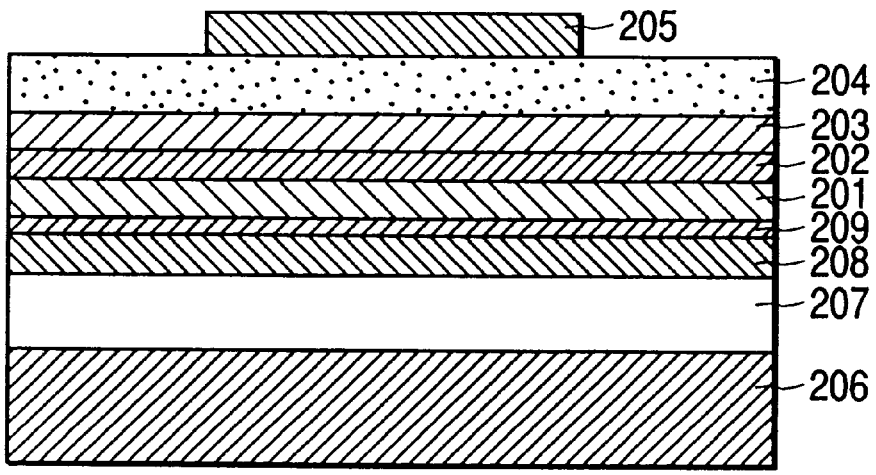
FIG. 5 is a schematic sectional view showing another example configuration of a conventional GMR memory device.

In the embodiment shown in FIG. 6, the magnetoresistive film 47 under the word line 55 constitutes a memory cell, an elementary unit of storage that stores one bit of information. Either "0" or "1" is written selectively into this memory cell depending on the direction of the current flowing through the word line 55 in a manner similar to the method described with reference to FIGS. 2A and 2B. For example, "0" is written when an electric current is passed through the word line 55 perpendicularly out of the drawing, and "1" is written when a current is passed through the word line 105 perpendicularly into the drawing. The relationship between the direction of current and the information written (i.e., "0" or "1") may be the other way around.

The field-effect transistor 51 can be used for switching during writing. The source region 48 of the field-effect transistor 51, the gate electrode 53 of the field-effect transistor 51, and the end of the magnetoresistive film 47 opposite to the end connected to the field-effect transistor 51 are electrically connected with terminals 56, 57, and 58, respectively. When a voltage is applied between the terminals 56 and 58 and a voltage is applied to the terminals 57, the field-effect transistor 51 is activated and a current flows through the magnetoresistive film 47. The current values may be set in such a way that information is recorded only when the magnetic fields generated by the individual currents are superposed, i.e., when a write current passes through the word line 55 while a current is flowing through the magnetoresistive film 47. In that case, passage of a current through the word line 55 alone will not cause information to be written if no current is flowing through the magnetoresistive film 47 with the field-effect transistor 51 being off. In other words, it is possible to control writing of information by turning on and off the field-effect transistor 51.

The information written into the GMR memory device of FIG. 6 can be read out in a manner similar to that described for FIGS. 3A to 4B. When the field-effect transistor 51 is activated by the application of a fixed voltage between terminals 56 and 58, a read current flows through the magnetoresistive film 47. In this state if an ac regenerative pulse current that changes its direction temporally is applied to the word line 55, the current flowing between the terminals 56 and 58 varies due to changes in the resistance value of the magnetoresistive film 47. By looking at whether the current changes from large to small or from small to large, it is possible to recognize whether the written information is "0" or "1".

The GMR memory device shown in FIG. 6 can be fabricated by a known micropatterning process exemplified by photolithography. Also, the first and second magnetic layers, non-magnetic layer, insulating layer, and word line can be formed by known processes such as vapor deposition, sputtering, and molecular-beam epitaxy (MBE).

Figure 7:
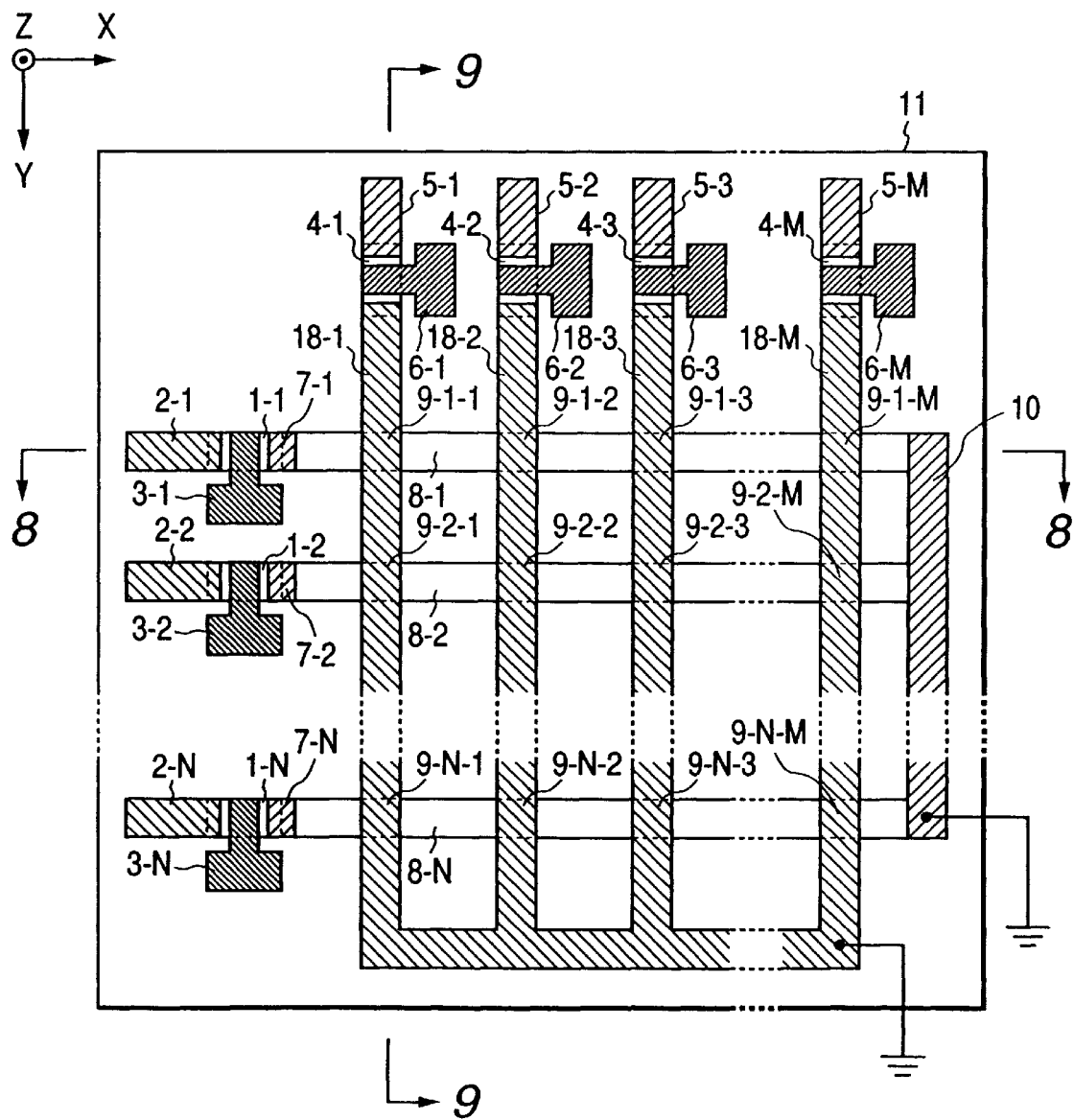
FIG. 7 is a schematic sectional view showing the second embodiment of the GMR memory device according to the present invention.
Figure 8:
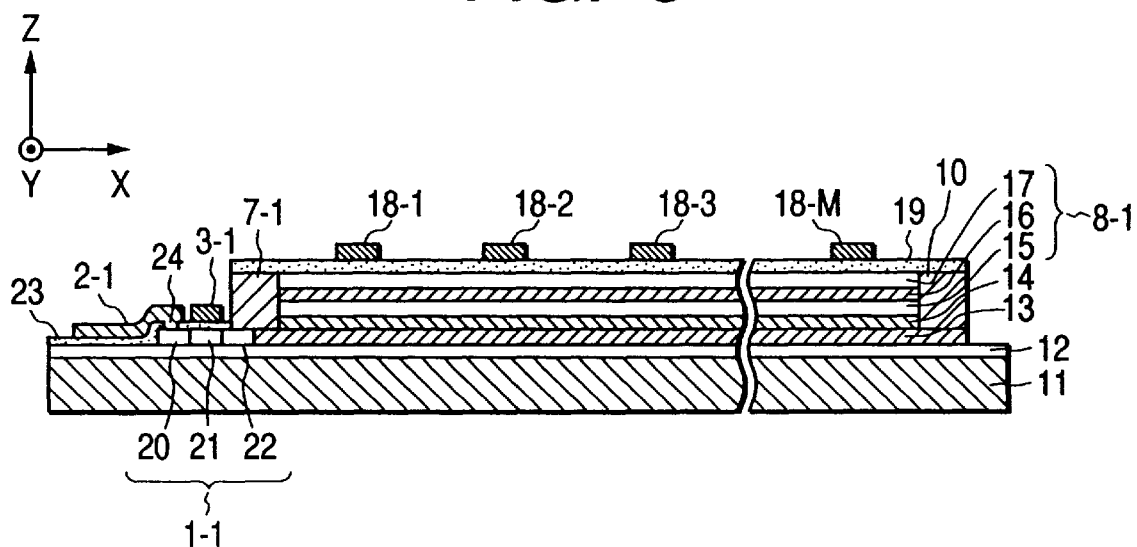
FIG. 8 is a schematic sectional view along line 8—8 of FIG. 7
Figure 9:
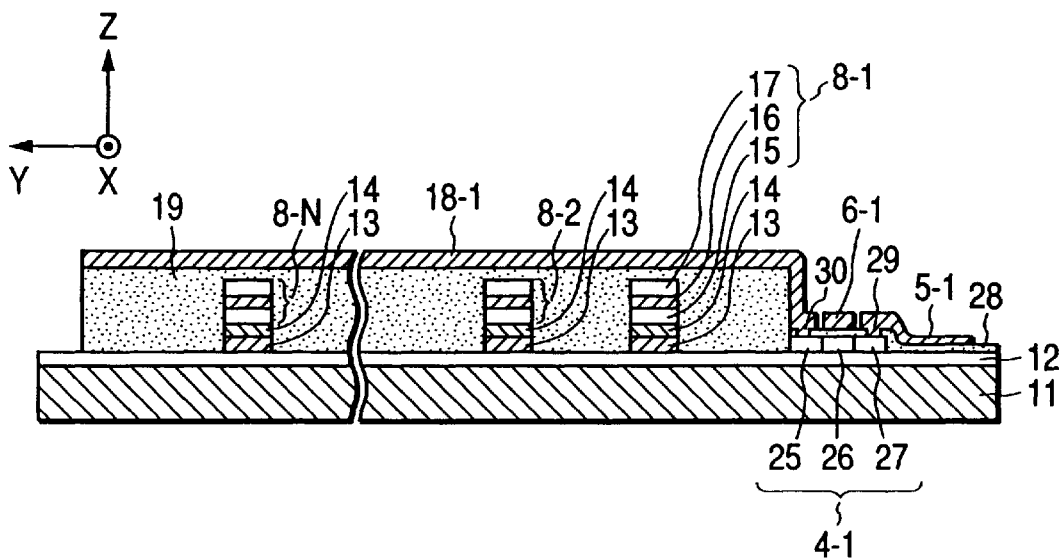
FIG. 9 is a schematic sectional view along line 9—9 of FIG. 7

FIGS. 7 to 9 show the second embodiment of the GMR memory device according to the present invention where memory cells such as the one described above are arranged in an M×N matrix on an SOI substrate (M and N are integers equal to or larger than 2). FIG. 7 is a plan view of the GMR memory device, FIG. 8 is a schematic sectional view along the line 8—8 of FIG. 7, and FIG. 9 is a schematic sectional view along the line 9—9 of FIG. 7. In these figures, the same parts are designated by the same reference numbers.

In these figures, 11 represents a silicon substrate on which a monocrystalline silicon layer 13 is formed, being separated by an insulating layer 12. These silicon substrate 11, insulating layer 12, and monocrystalline silicon layer 13 form a so-called SOI substrate. The SOI substrate used in this embodiment can also be fabricated by the known substrate manufacturing processes described in relation to the first embodiment. The monocrystalline silicon layer 13 is patterned as lines extending in the X direction and N lines of the monocrystalline silicon layer 13 are arranged in parallel to one another in the Y direction. The monocrystalline silicon layer 13 is also used to form M field-effect transistors 4-1 to 4-M arranged side by side in the X direction. After forming the N lines and field-effect transistors 4-1 to 4-M, the rest of the monocrystalline silicon layer 13 is etched away down to the insulating layer 12.

The N lines of the monocrystalline silicon layer 13 left on the substrate have field-effect transistors 1-1 to 1-N formed on one end, respectively. Each of the field-effect transistors 1-1 to 1-N has a source region 20, gate region 21, and drain region 22. Gate electrodes 3-1 to 3-N are formed on the gate region 21, separated by a thin gate insulating layer 23. A contact hole 24 is formed in the gate insulating layer 23 on the source region 20 and source electrodes 2-1 to 2-N are connected electronically to the source region 20. The field-effect transistors 1-1 to 1-N are fabricated by a known semiconductor process such as the impurity diffusion described in relation to the first embodiment.

On the other hand, the field-effect transistors 4-1 to 4-M have a source region 27, gate region 26, and drain region 25. Gate electrodes 6-1 to 6-M are formed on the gate region 26, separated by a thin gate insulating layer 28. A contact hole 29 is formed in the gate insulating layer 28 on the source region 27 and source electrodes 5-1 to 5-M are connected electronically to the source region 27. The field-effect transistors 4-1 to 4-M are fabricated by a known semiconductor process such as impurity diffusion, using the monocrystalline silicon layer 13 left on the substrate, as is the case with the field-effect transistors 1-1 to 1-N.

On the N lines of the monocrystalline silicon layer 13, sandwiching a buffer layer 14, magnetoresistive films 8-1 to 8-N are formed as lines extending in the X direction and parallel to one another in the Y direction. Each of the magnetoresistive films 8-1 to 8-N comprises a first magnetic layer 15, non-magnetic layer 16, and second magnetic layer 17. These layers are made of similar materials and formed to similar thicknesses to those described in relation to the first embodiment.

The magnetoresistive films 8-1 to 8-N have sense lines 7-1 to 7-N formed, respectively, at the end where the field-effect transistors 1-1 to 1-N are installed. These sense lines 7-1 to 7-N are used to electrically connect the drain regions 22 of the field-effect transistors 1-1 to 1-N and the magnetoresistive films 8-1 to 8-N well. Therefore, they are made of a highly conductive material, preferably a metal such as Al, Cu, or Au. At the other end, magnetoresistive films 8-1 to 8-N are electrically connected to each other by a sense line 10 and earth grounded. This sense line 10 is also desirably made of a highly conductive metal such as Al, Cu, or Au.

An insulating layer 19 is formed on the magnetoresistive films 8-1 to 8-N. This insulating layer 19 not only covers the magnetoresistive films 8-1 to 8-N, but also is formed on the insulating layer 12 among the magnetoresistive films, filling the gaps among them to make the top surface flat. On this insulating layer 19, word lines (writing rays) 18-1 to 18-M are formed as lines extending in the Y direction and parallel to one another in the X direction. The word lines 18-1 to 18-M are electrically connected at one end to the drain regions 25 of the field-effect transistors 4-1 to 4-M, respectively, through a contact hole 30 formed in the gate insulating layer 28, as shown in FIG. 9. At the other end, the word lines 18-1 to 18-M are electrically connected to each other and earth grounded. The insulating layer 19 and word lines 18-1 to 18-M are made of similar materials and formed to similar thicknesses to those described in relation to the first embodiment.

The magnetoresistive films 8-1 to 8-N under the word lines 18-1 to 18-M are to become memory cells each of which stores one bit of information. Thus, as can be seen from FIG. 7, memory cells 9-1-1, 9-1-2, . . . , 9-N-M are formed at the intersections (overlapping portions) of the word lines 18-1 to 18-M and magnetoresistive films 8-1 to 8-N, resulting in M×N memory cells arranges in a matrix. In this embodiment, although individual memory cells are not separated, only the portions under the word lines function as memory since a magnetic wall is formed in each magnetic layer. Therefore, this embodiment can simplify the patterning used for fabrication of GMR memory devices, resulting in reduced fabrication costs.

Figure 10:
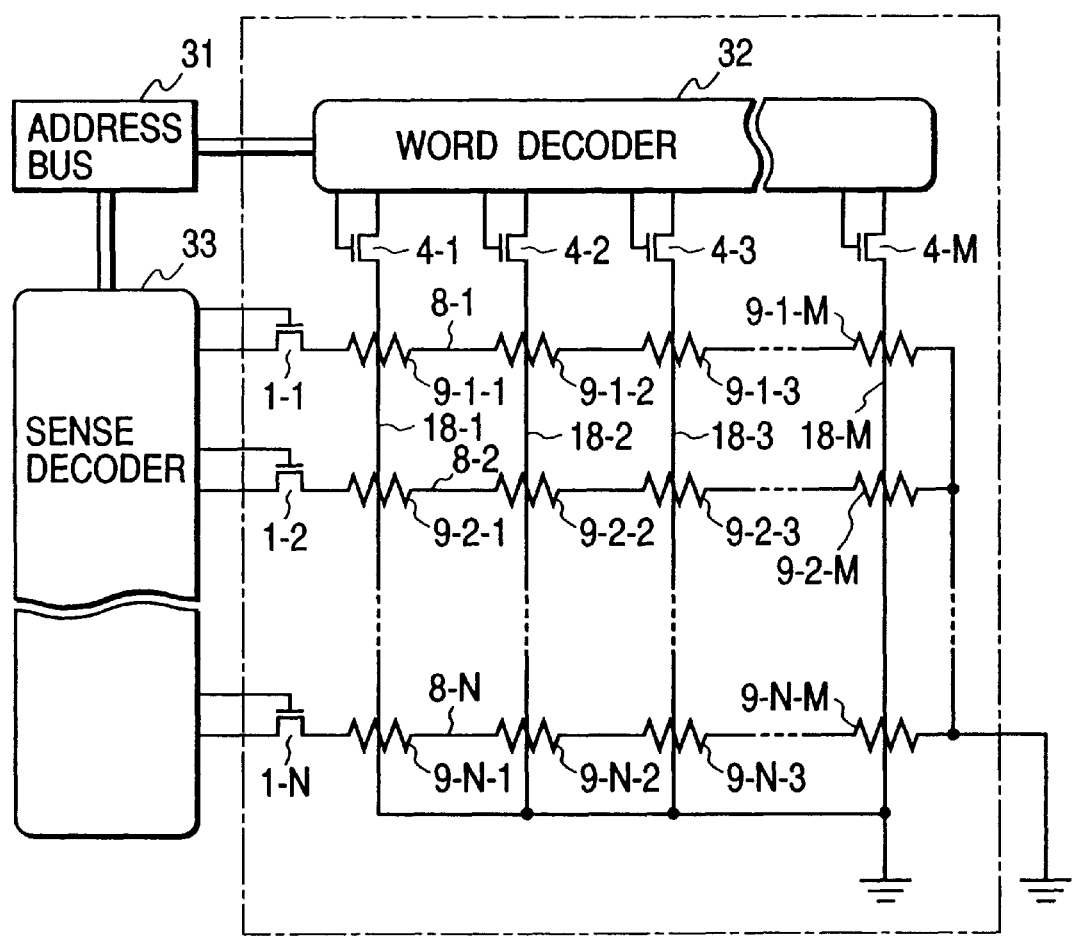
FIG. 10 is a circuit diagram of a memory unit employing the second embodiment of the GMR memory device.

FIG. 10 is a circuit diagram of a memory unit employing the GMR memory device shown in FIGS. 7 to 9. In FIG. 10, the same parts as those in FIGS. 7 to 9 are designated by the same reference numbers and detailed descriptions thereof are omitted.

The address bus 31 is used for specifying the memory cells to write to or read from. The address signals that represent specific memory cells are sent to a sense decoder 33 and word decoder 32 to run read/write operations. The sense decoder 33 have the capabilities to control the current to supply to magnetoresistive films by switching on and off the field-effect transistors 1-1 to 1-N as well as to detect resistance changes in the magnetoresistive films by measuring the current flowing through the magnetoresistive films. On the other hand the word decoder 32 has the capabilities to switch on and off the field-effect transistors 4-1 to 4-M as well as to generate a current to pass through the word lines and control the value of this current.

Now a description will be given of how to write information into a memory cell, taking the cell 9-2-2 as an example. First, the address bus 31 sends an address signal to the sense decoder 33 and word decoder 32, instructing them to select the cell 9-2-2. Upon receipt of the instruction, the sense decoder 33 selects magnetoresistive film 8-2 where the cell 9-2-2 has been formed by sending an activation command to the gate of the field-effect transistor 1-2 and supplies a sense current to the magnetoresistive film 8-2. On the other hand, word decoder 32, upon receipt of the instruction, selects the word line 18-2 by sending an activation command to the gate of the field-effect transistor 4-2 connected to the word line 18-2 and supplies a word current to the word line 18-2. Since the word current is in write mode at this time, a current larger than the word current used for reading is applied.

In this way, the resultant magnetic field composed of the superposed magnetic fields generated by the currents applied to individual lines are applied to the cell 9-2-2 located directly under the word line 4-2 of the magnetoresistive film 8-2. The resultant magnetic field generated is large enough to reverse not only the magnetization direction of the read layer, but also the magnetization direction of the write layer that stores information. Therefore, either "0" or "1" is written according to the direction of the word line current at the given time. By the application of similar procedures to all the cells, information is written into the entire memory area quickly and nondestructively.

Now a description will be given of how to read information out of a memory cell, taking the cell 9-2-2 as an example. First, the address bus 31 sends an address signal to the sense decoder 33 and word decoder 32, instructing them to select the cell 9-2-2. Upon receipt of the instruction, the sense decoder 33 selects magnetoresistive film 8-2 where the cell 9-2-2 has been formed by sending an activation command to the gate of the field-effect transistor 1-2 and supplies a sense current to the magnetoresistive film 8-2. On the other hand, word decoder 32, upon receipt of the instruction, selects the word line 18-2 by sending an activation command to the gate of the field-effect transistor 4-2 connected to the word line 18-2 and supplies a word current to the word line 18-2. Since the word current is in read mode at this time, a current smaller than the word current used for writing is applied.

In this way, the resultant magnetic field composed of the superposed magnetic fields generated by the currents applied to individual lines are applied to the cell 9-2-2 located directly under the word line 4-2 of the magnetoresistive film 8-2. The resultant magnetic field generated is large enough to reverse the magnetization direction of the read layer although the magnetization direction of the write layer that stores information remains fixed. Therefore, information can be read out through the detection of resistance variations by sorting the directions of the sense current into two directions with the sense decoder according to the type of recorded information: "0" or "1". By the application of similar procedures to all the cells, information is read out of the entire memory area quickly and nondestructively.

In this embodiment, the principles of reading and writing information are similar to those described with reference to FIGS. 2A to 4B and in relation to the first embodiment.

In FIG. 10, the part enclosed by alternate long and short dash lines corresponds to the GMR memory device shown in FIGS. 7 to 9. In this embodiment, the address bus 31, sense decoder 33, and word decoder 32 were fabricated separately from the GMR memory device and then connected to the GMR memory device. However, it is also possible to form these circuits monolithically with a GMR memory device on the same SOI substrate by using a monocrystalline silicon layer formed on the substrate.

Concrete examples are presented below.

EXAMPLE 1

A GMR memory device of the configuration shown in FIGS. 7 to 9 was fabricated. It was a 64 bit GMR memory device made up of 2 $\mu$m square memory cells arranged in an 8×8 matrix. It contained eight each magnetoresistive films and word lines. The SOI substrate used was an 8-inch substrate fabricated by the method described in U.S. Pat. No. 5,371,037 cited earlier.

The thicknesses of the Si layer were 30 nm, 50 to 600 nm in increments of 50 nm, and 700 to 1000 nm in increments of 100 nm. The crystal orientation was 100 and the crystal had a lightly doped n-shape. The $SiO_2$ layer was 1 $\mu$m thick.

The substrate was patterned by photolithography and the areas for film formation and milling were defined by a resist mask. To prevent impurity elements from mixing, the semiconductor processes other than the magnetoresistive film process were carried out first and the substrate was covered with a protective film.

Sputtering equipment was used for the formation of the magnetoresistive films. The buffer layer (SiN), first magnetic layer ($Ni_{80}Fe_{20}$), non-magnetic layer (Cu), second magnetic layer (Co), insulating film (SiN), sense line (Al), and word line (Al) were formed with the ultimate pressure set at less than $5 \times 10^{-5}$ Pa.

As to film thickness, the buffer layer (SiN) was 5 nm, first magnetic layer ($Ni_{80}Fe_{21}$)—10 nm, non-magnetic layer (Cu)—5 nm, second magnetic layer (Co)—10 nm, insulating film (SiN)—30 nm, sense line (Al)—30 nm, and word line (Al)—50 nm. The first magnetic layer made of soft magnetic material functions as the read (reproducing) layer, and the second magnetic layer made of hard magnetic material functions as the write (memory) layer.

During the film formation, permanent magnets were placed to provide an equal magnetic anisotropy in the direction of the substrate surface. The magnetic field intensity generated by the permanent magnets was 20 Oe at the center of measurement. Actual element patterns were formed by ion milling and lift-off.

The characteristics of the 64-bit memory device thus produced were evaluated by issuing access signals. An all-around assessment was made considering power consumption, access speed, access performance, and stability as memory, and the results are shown in Table 1. Good characteristics were obtained when the thickness of the Si layer was between 50 and 500 nm.

Among others, the best results were obtained when the thickness of the Si layer was between 50 and 250 nm. Based on the above results, similar procedures were repeated by using SOI substrates 50 to 250 nm thick in increments of 10 nm to make a more detailed study and it was found that more preferably the thickness of the SOI substrate should be between 60 and 120 nm. With the 30-nm substrate and 550-nm and thicker substrates, the performance was poor, and power consumption remained high, resulting in slow switching speed or unstable operation of the switching transistors.

TABLE 1

| Film thickness (nm) | 30 | 50 | 100 | 150 | 200 | 250 | 300 | 350 | 400 |
|---|---|---|---|---|---|---|---|---|---|
| Performance | X | ○ | ⊚ | ⊚ | ⊚ | ⊚ | ○ | ○ | ○ |
| Film thickness (nm) | 450 | 500 | 550 | 600 | 700 | 800 | 900 | 1000 | |
| Performance | ○ | ○ | X | X | X | X | X | X | |

Note: The relationship between Si layer thickness and memory performance (⊚: very good; ○: good; ×: poor)

Figure 11:
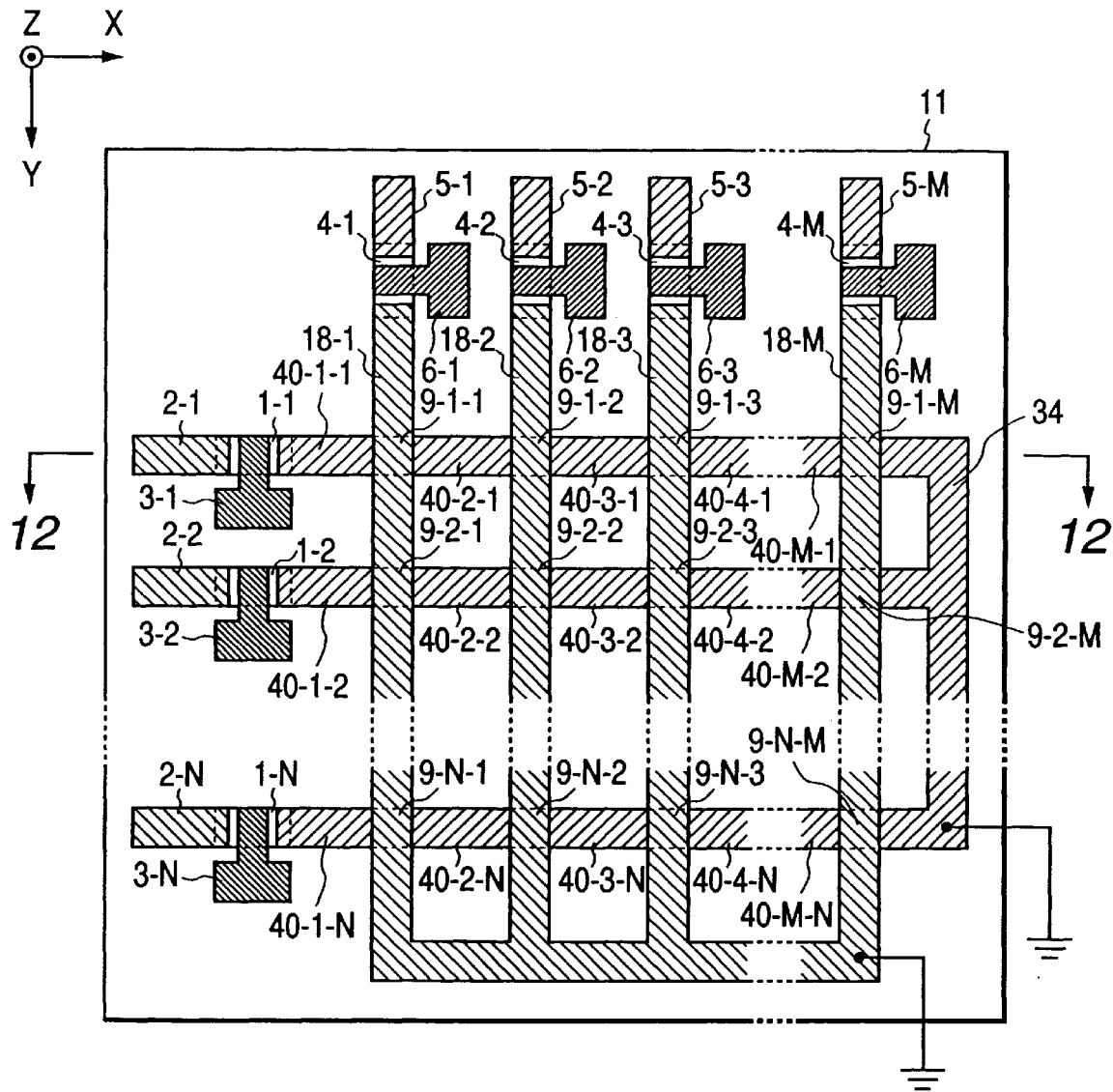
FIG. 11 is a schematic plan view showing the third embodiment of the GMR memory device according to the present invention.
Figure 12:
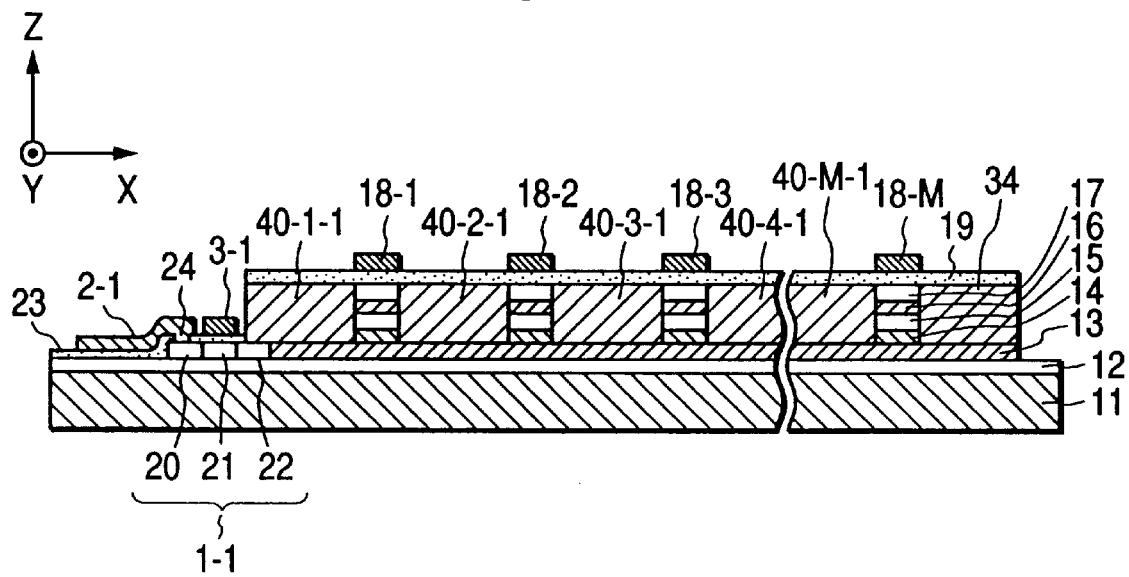
FIG. 12 is a schematic sectional view along line 12—12 of FIG. 11.

FIGS. 11 and 12 show the third embodiment of the GMR memory device according to the present invention where memory cells are arranged in an M×N matrix on an SOI substrate. FIG. 11 is a plan view of the GMR memory device while FIG. 12 is a schematic sectional view along the line 12—12 of FIG. 11. The schematic sectional view along the Y axis, which is the same as in FIG. 9, is omitted. In FIGS. 11 and 12, the same parts as those in FIGS. 7 to 9 are designated by the same reference numbers and descriptions thereof are omitted.

This embodiment differs from the second embodiment only in that the magnetoresistive films are removed except for the portion under the word lines composing memory cells with the remaining portion connected by sense lines 40-1-1, 40-2-1, . . . , 40-M-N. This embodiment makes it possible to adjust the magnitude of the combined resistance connected to the drain region of a field-effect transistor by adjusting the electrical conductivity of the sense lines. This embodiment can be achieved with materials and methods similar to those of the second embodiment. Write and read operations are performed in a manner similar to that of the second embodiment as well.

EXAMPLE 2

A GMR memory device of the configuration shown in FIGS. 11 and 12 was fabricated. It was a 64 bit GMR memory device made up of 2 $\mu$m square memory cells arranged in an 8×8 matrix. It contained eight each magnetoresistive films and word lines. The SOI substrate used was an 8-inch substrate fabricated by the method described in U.S. Pat. No. 5,371,037 cited earlier.

The magnetoresistive films and the like were created by using materials and methods similar to those of Example 1. Al films were used for the sense lines.

The characteristics of the 64-bit memory device thus produced were evaluated by entering access signals. Regarding power consumption, access speed, access performance, and stability as memory, the results were exactly equal to those of Example 1.

Good results were obtained when the thickness of the monocrystalline silicon layer was between 50 and 500 nm. Among others, the best results were obtained when the thickness of the Si layer was between 50 and 250 nm. With the 30-nm substrate and 550-nm and thicker substrates, the performance was poor, and power consumption remained high, resulting in slow switching speed or unstable operation of the switching transistors.

Figure 14:
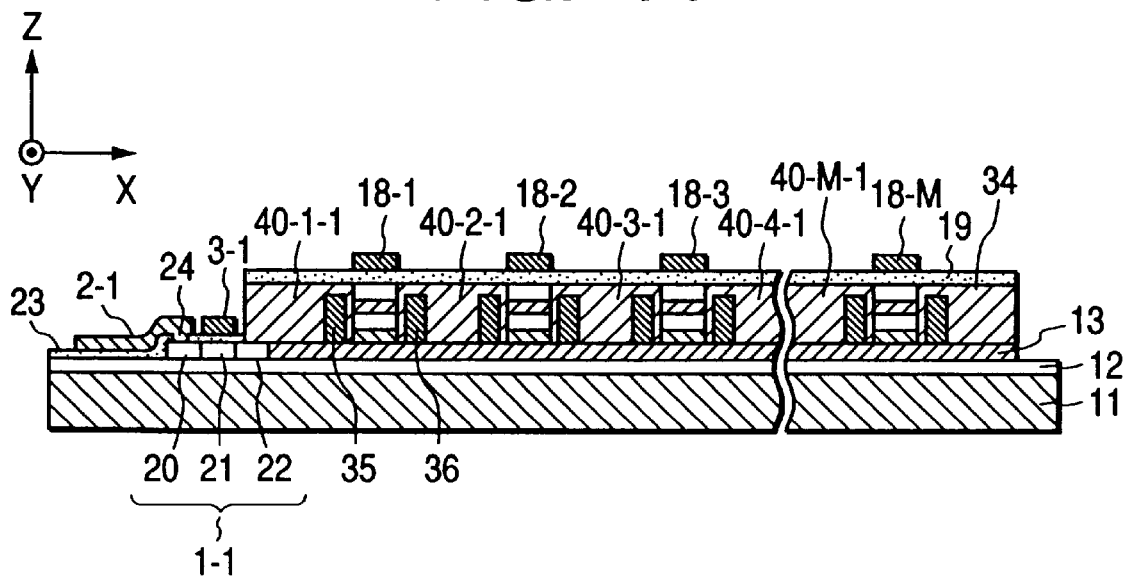
FIG. 14 is a schematic sectional view along line 14—14 of FIG. 13.
Figure 13:
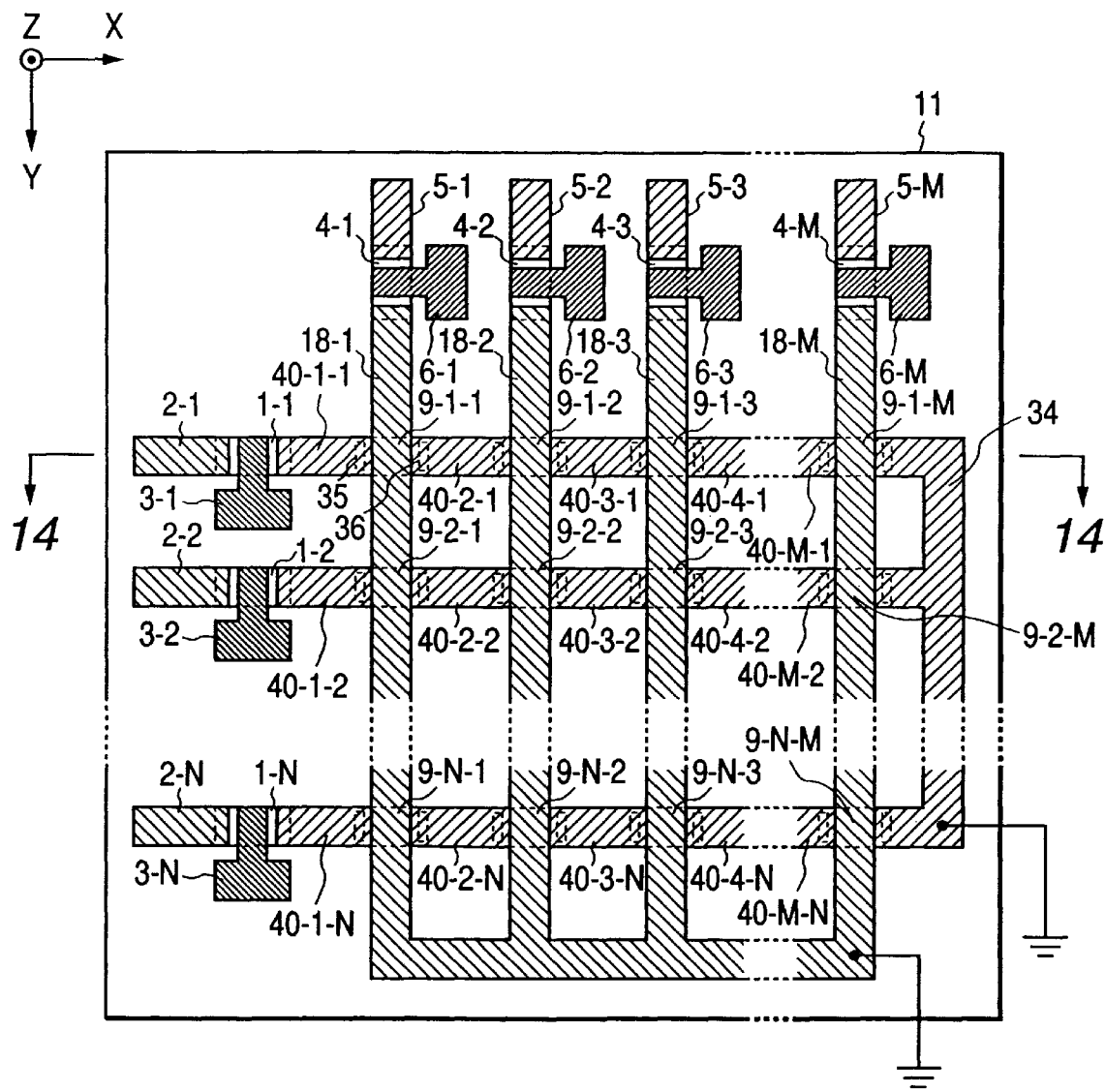
FIG. 13 is a schematic plan view showing the fourth embodiment of the GMR memory device according to the present invention.

FIGS. 13 and 14 show the fourth embodiment of the GMR memory device according to the present invention where memory cells are arranged in an M×N matrix on an SOI substrate. FIG. 13 is a plan view of the GMR memory device while FIG. 14 is a schematic sectional view along the line 14—14 of FIG. 13. The schematic sectional view along the Y axis, which is the same as in FIG. 9, is omitted. In FIGS. 13 and 14, the same parts as those in FIGS. 11 to 12 are designated by the same reference numbers and descriptions thereof are omitted.

This embodiment differs from the third embodiment only in that magnetic-field concentrating layers 35 and 36 were placed on both sides of each memory cell to concentrate the magnetic fields generated by the word lines on the memory cells.

Since the current passed through the word lines was larger than the current passed through the sense lines, the magnetic fields generated were large and constituted the main components of the resultant magnetic field. The magnetic field generated by a word line diffuses under the action of the diamagnetic field. High integration of memory cells reduces the spacing between them, making it impossible to ignore the effect of the magnetic fields generated by the word lines of the adjacent cells. To minimize this effect, it is necessary to concentrate the magnetic field of a word line on the given cell as much as possible.

Concentration of the magnetic field on a memory cell can be achieved through installation of magnetic-field concentrating layers made of a high-permeability material around the memory cell consisting of a ferromagnetic layer, nonmagnetic layer, and ferromagnetic layer because both the generated magnetic field and diamagnetic field will then pass through the magnetic-field concentrating layers.

EXAMPLE 3

A GMR memory device of the configuration shown in FIGS. 13 and 14 was fabricated. It was a 64 bit GMR memory device made up of 2 $\mu$m square memory cells arranged in an 8×8 matrix. It contained eight each magnetoresistive films and word lines. The SOI substrate used was an 8-inch substrate fabricated by the method described in U.S. Pat. No. 5,371,037 cited earlier.

The magnetoresistive films and the like were created by using materials and methods similar to those of Example 1. Magnetic-field concentrating layers 35 and 36 made of a 10-nm wide, 50-nm high FeN film were placed 2 $\mu$m away from both sides of each memory cell with an area of 4 $\mu m^2$.

The characteristics of the 64-bit memory device thus produced were evaluated by entering access signals. An all-around assessment was made considering power consumption, access speed, access performance, and stability as memory, and the results are shown in Table 2.

Good results were obtained when the thickness of the monocrystalline silicon layer was between 50 and 500 nm. Among others, the best results were obtained when the thickness was between 100 and 250 nm. With the 30-nm substrate and 550-nm and thicker substrates, the performance was poor, and power consumption remained high, resulting in slow switching speed or unstable operation of the switching transistors.

TABLE 2

| Film thickness (nm) | 30 | 50 | 100 | 150 | 200 | 250 | 300 | 350 | 400 |
|---|---|---|---|---|---|---|---|---|---|
| Performance | X | ○ | ⊙ | ⊙ | ⊙ | ⊙ | ○ | ○ | ○ |
| Film thickness (nm) | 450 | 500 | 550 | 600 | 700 | 800 | 900 | 1000 | |
| Performance | ○ | ○ | X | X | X | X | X | X | |

Note: The relationship between Si layer thickness and memory performance (⊙: very good; ○: good; ×: poor)

All the embodiments described so far mounted word lines on magnetoresistive films with an insulating layer interposed between the two layers. However, the GMR memory device according to this invention also makes it possible to place word lines under magnetoresistive films. An example is shown below.

Figure 15:
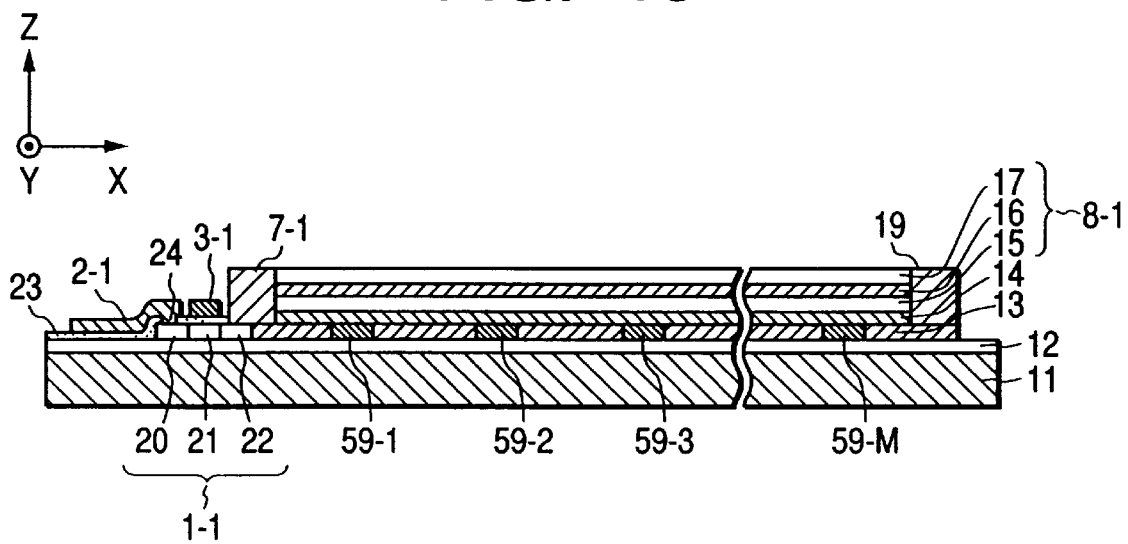
FIGS. 15 and 16 are schematic sectional views showing the fifth embodiment of the GMR memory device according to the present invention.
Figure 16:
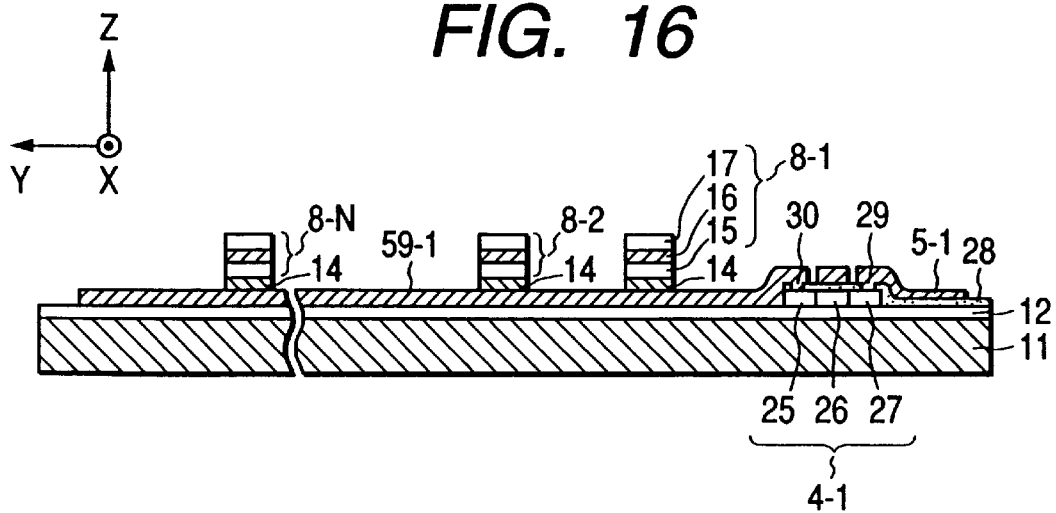

FIGS. 15 and 16 show the fifth embodiment of the GMR memory device according to the present invention, which is similar to the second embodiment described in FIGS. 7 to 9 except that word lines are placed under magnetoresistive films. FIG. 15 is a schematic sectional view along the X direction corresponding to FIG. 8 while FIG. 16 is a schematic sectional view along the Y direction corresponding to FIG. 9. In FIGS. 15 and 16, the same parts as those in FIGS. 7 to 9 are designated by the same reference numbers and descriptions thereof are omitted.

In this embodiment, word lines 59-1 to 59-N are mounted instead of the word lines 18-1 to 18-N of FIG. 8 under the magnetoresistive film 8-1 in such a way as to be buried in the monocrystalline silicon layer 13. Therefore, this embodiment lacks the insulating layer 19 shown in FIGS. 8 and 9. One end of the word line 59-1 is electrically connected to the drain region 25 of the field-effect transistor 4-1 through a contact hole 30 formed in the gate insulating layer 28.

Also in this embodiment, word lines 59-1 to 59-N are desirably made of a highly conductive metal such as Al, Cu, or Au. In this embodiment, the buffer layer 14 should be made of an insulating material to insulate the word lines and magnetoresistive films. Although the word lines 59-1 to 59-N are buried in the monocrystalline silicon layer 13 in FIGS. 15 and 16, it is possible to form a protective layer on the monocrystalline silicon layer 13 and then form the word lines on it. This embodiment can employ materials, methods, and write and read operations similar to any of the embodiments described so far.

A concrete example configuration of this embodiment is shown below.

EXAMPLE 4

The sample created was a 64 bit GMR memory device made up of 2 μm square memory cells arranged in an 8×8 matrix. It contained eight each magnetoresistive films and word lines. The SOI substrate used was an 8-inch substrate fabricated by the method described in U.S. Pat. No. 5,371, 037 cited earlier. The crystal orientation was 100 and the crystal had a lightly doped n-shape. The $SiO_2$ layer was 1 μm thick.

The substrate was patterned by photolithography and the areas for film formation and milling were defined by a resist mask. To prevent impurity elements from mixing, the semiconductor processes other than the magnetoresistive film process were carried out first and the substrate was covered with a protective film. Word lines were formed on the monocrystalline silicon layers. The Al film that constituted the word lines was 50 nm thick.

Sputtering equipment was used for the formation of the magnetoresistive films. The buffer layer (SiN), first magnetic layer ($Ni_{80}Fe_{20}$), non-magnetic layer (Cu), second magnetic layer (Co), insulating layer (SiN), and sense line (Al) were formed with the ultimate pressure set at less than $5 \times 10^{-5}$ Pa. The film thickness was 5 nm in the buffer layer (SiN), 10 nm in the first magnetic layer ($Ni_{80}Fe_{20}$), 5 nm in the non-magnetic layer (Cu), 10 nm in the second magnetic layer (Co), 30 nm in the insulating film (SiN), and 30 nm in the sense line (Al) to be connected to the magnetoresistive film. The first magnetic layer made of soft magnetic material functions as the read (reproducing) layer, and the second magnetic layer made of hard magnetic material functions as the write (memory) layer. During the film formation, permanent magnets were placed to provide an equal magnetic anisotropy in the direction of the substrate surface. The magnetic field intensity generated by the permanent magnets was 20 Oe at the center of measurement.

Actual element patterns were formed by ion milling and lift-off. The characteristics of the 64-bit memory device thus produced were evaluated by issuing access signals. An all-around assessment was made considering power consumption, access speed, access performance, and stability as memory, and good characteristics were obtained.

Figure 17:
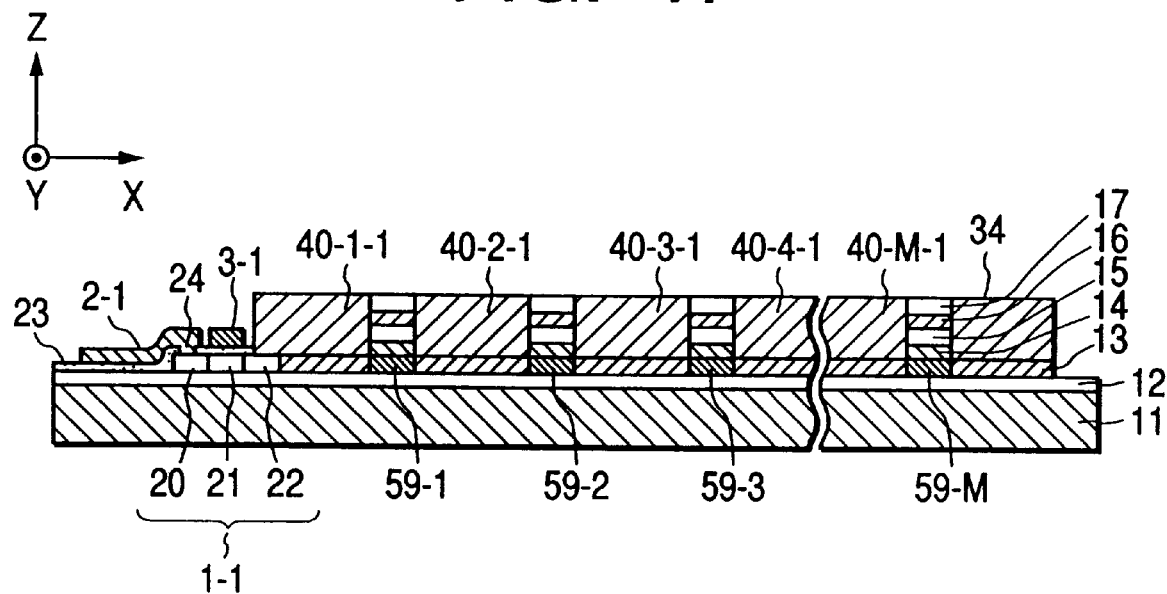
FIG. 17 is a schematic sectional view showing the sixth embodiment of the GMR memory device according to the present invention.

FIG. 17 is a view showing the sixth embodiment of the GMR memory device according to the present invention, which is similar to the third embodiment described in FIGS. 11 to 12 except that word lines are placed under magnetoresistive films. FIG. 17 is a schematic sectional view along the X direction corresponding to FIG. 12. In FIG. 17, the same parts as those in FIG. 12 are designated by the same reference numbers and descriptions thereof are omitted. In this embodiment, word lines 59-1 to 59-N are mounted instead of the word lines 18-1 to 18-N of FIG. 12 in such a way as to be buried in the monocrystalline silicon layer 13 under the magnetoresistive films. Therefore, this embodiment lacks the insulating layer 19 shown in FIG. 12.

Also in this embodiment, word lines 59-1 to 59-N are desirably made of a highly conductive metal such as Al, Cu, or Au. In this embodiment, the buffer layer 14 should be made of an insulating material to insulate the word lines and magnetoresistive films. Although the word lines 59-1 to 59-N are buried in the monocrystalline silicon layer 13 in FIG. 17, it is possible to form a protective layer on the monocrystalline silicon layer 13 and then form the word lines on it. This embodiment can also employ materials, methods, and write and read operations similar to any of the embodiments described so far.

The embodiments described so far were of a so-called CIP (Current In Plane) type, where current flows parallel to the surface of the magnetoresistive film. However, a so-called CPP (Current Perpendicular to the Plane) type in which current flows perpendicular to the film surface is also known in relation to GMR memory devices. This will be explained below.

In terms of materials and mechanisms, GMR memory devices are classified into the spin scattering type that employs a non-magnetic metal layer, spin valve type in which the magnetization direction of one ferromagnetic layer is fixed by an antiferromagnetic layer, spin tunneling type that employs a non-magnetic insulation layer, granular type in which magnetic particulates are scattered in a non-magnetic layer, and CMR (Colossal Magneto Resistance) type that employs a perovskite oxide film.

In the spin scattering type, the non-magnetic layer is made of a metal such as Cu, and GMR is produced by means of spin-dependent scattering between two magnetic layers. When the magnetization directions of the two magnetic layers are parallel, the electrons whose spin direction is opposite to the magnetization direction are scattered while the electrons whose spin direction is the same as the magnetization direction are not scattered, and thus the resistance is lowered as a whole.

In contrast, when the magnetization directions of the two magnetic layers are anti-parallel, both the electrons whose spin direction is opposite to the magnetization direction and electrons whose spin direction is the same as the magnetization direction are scattered, raising the resistance as a whole. The MR ratio is approximately 5 to 10% at room temperature. This is larger than anisotropic magnetoresistance which depends on the directions of electric current and magnetization, but smaller than the MR ratio of the spin tunneling type.

The spin valve type, which is based on the same principle as the spin scattering type, differs from the latter in that the magnetization direction is pinned by the pairing of one ferromagnetic layer with an antiferromagnetic layer.

The magnetization direction of the other magnetic layer can be spinned freely. Its magnetization curve has an asymmetric shape in the direction of magnetization and changes linearly from low to high resistance in the vicinity of zero magnetic field. Therefore, this type is suitable for a magnetic sensor for detecting very small magnetism.

Today it has found applications to read sensors for hard-disk drives.

With the spin tunneling type, electrons move between magnetic layers, tunneling through a non-magnetic layer which acts as an insulator, and GMR is produced relying on the differences in the state densities of spin electrons. In other words, when the magnetization directions of the magnetic layers are parallel, up-spin electrons can tunnel to the other magnetic layer freely and assume there an up-spin state and down-spin electrons can tunnel freely to the other magnetic layer and assume there a down-spin state, reducing the differences in the state densities of spin electrons, which in turn lowers the resistance.

In contrast, when the magnetization directions of the magnetic layers are anti-parallel, neither up-spin nor down-spin electrons can tunnel, increasing the differences in the state densities of spin electrons, which in turn raises the resistance. The MR ratio is approximately 10 to 30% at room temperature. This is larger than the MR ratio of the spin scattering type. However, since an insulator is sandwiched, this type has higher resistance than the spin scattering type. Studies are conducted actively on spin valve type magnetoresistive films that employ antiferromagnetic films while making use of the spin tunneling phenomenon, to seek possible applications to next generation read sensors for hard disk drives.

The granular type is further divided into the spin scattering type that uses metal for the non-magnetic layer and the spin tunneling type that uses an insulator. Compared to the spin scattering type and spin tunneling type described earlier where each layer has a definite role assigned to it, the granular type differs greatly in that it produces GMR relying on the spins of individual micromagnetic particles scattered in a matrix. With a Co/AlO$_x$-based spin tunneling type, an MR ratio on the order of 8% is available at room temperature.

The CMR type includes a tunnel junction that sandwiches a perovskite-type manganese oxide layer between layers of a perovskite manganese oxide that has a higher degree of spin polarization and a tunnel junction that utilizes the layered structure in a perovskite. Since the CMR type has very high spin polarization, an MR ratio as high as 400% is available at cryogenic temperatures.

As described above, GMR memory devices are divided into the CIP and CPP types in terms of the direction of current flow. The embodiments 1 to 6 described above are all of the CIP type.

For the CIP type, spin scattering type magnetoresistive films are used. In this case, the sheet resistance of one cell is 10 Ω and the sheet resistance of a sense line is 0.5 Ω. MR ratio is approximately 5 to 10%, which is smaller than that of the spin tunneling type.

In the CIP structure, when many cells are connected in series to sense lines and signals are detected at both ends, the S/N ratio is degraded because a signal equivalent to the resistance change of one cell is output for the combined resistance of many connected cells.

For the CPP type, spin tunneling type magnetoresistive films should be used. The resistance for one cell is larger than in the case of sense lines, ranging from several kilo-ohms to tens of kilo-ohms. MR ratio is approximately 10 to 30%, which is larger than that of the spin scattering type.

In other words, connecting magnetoresistive films to sense lines will result in sufficiently large resistance change, and thus a high S/N ratio. In the CPP structure, when many cells are to be arranged, they are connected in parallel because they are connected to the intersections of sense lines. Therefore, when detecting the resistance of a specific cell, the S/N ratio is better than in the case of the CIP type because it can be detected without much influence from other cells if current is passed through the sense lines that intersect the cell.

Consequently, more cells can be connected to one sense line, which makes it easy to create a large matrix.

Thus, when it is necessary to arrange a large number of memory cells in a memory device, the CPP structure is more advantageous.

An embodiment of the CPP type, the type which passes current perpendicularly to a magnetoresistive film will be described below.

Figure 18:
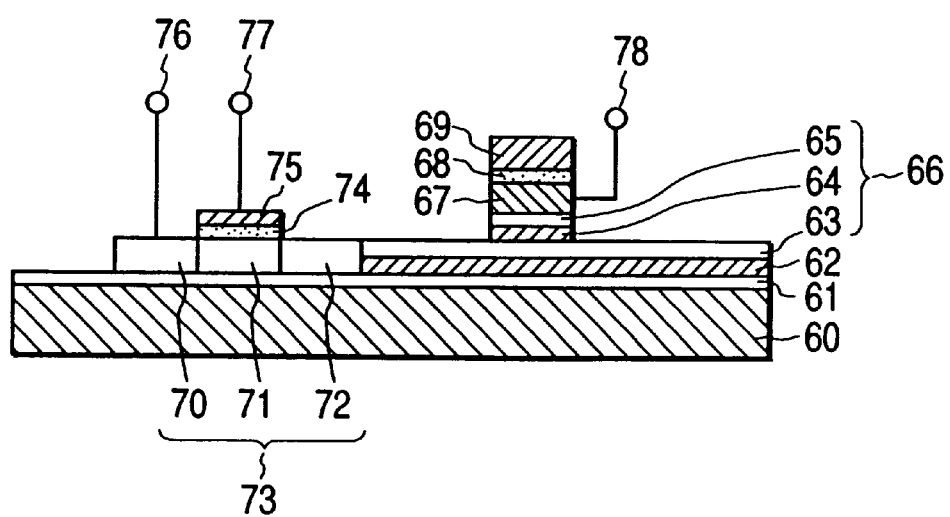
FIG. 18 is a schematic sectional view showing the seventh embodiment of the GMR memory device according to the present invention.

FIG. 18 is a schematic sectional view showing the seventh embodiment of the GMR memory device according to the present invention. This seventh embodiment represents the simplest configuration that comprises one memory cell capable of storing one bit of information and one switching element for switching this memory cell.

In FIG. 18, 60 represents a silicon substrate and 61 represents an insulating layer made of SiO$_2$ and formed on the silicon substrate 60. A monocrystalline silicon layer is formed on the insulating layer 61. The silicon substrate 60, insulating layer 61, and monocrystalline silicon layer compose a so-called SOI substrate. The thickness of the insulating layer 61, which is selected, as required, depending on the configuration of the memory device to be fabricated, should preferably be between 100 nm and 1 μm in order to obtain good insulability.

Such an SOI substrate is fabricated by the method described in the U.S. Pat. No. 5,371,037 cited earlier, the method described in the U.S. Pat. No. 5,374,564, or other similar methods.

The monocrystalline silicon layer is removed from the insulating layer 61 by etching or the like, leaving some part. A source region 70, gate region 71, and drain region 72 are formed on the remaining monocrystalline silicon layer. A gate electrode 75 is formed on the gate region 71 with a gate insulating layer 74 interposed between them. These together compose a field-effect transistor (FET) 73. It is fabricated by known semiconductor processes. For example, the source region 70, gate region 71, and drain region 72 can be formed by a method of diffusing impurities into part of the monocrystalline silicon layer.

A lower sense (read) line 62 is formed on the insulating layer 61 from which the monocrystalline silicon layer has been removed. On this lower sense line 62, a magnetoresistive film 66 is formed by stacking up first magnetic layer 63, non-magnetic layer 64, and second magnetic layer 65 in sequence. The second magnetic layer 65 has higher coercive force than the first magnetic layer 63 at room temperature. In other words, the second magnetic layer 65 serves the function of the memory layer (write layer) described with reference to FIG. 1 and the first magnetic layer 63 serves the function of the reproducing layer (read layer).

Both first magnetic layer 63 and second magnetic layer 65 are made of Ni, Fe, Co, or an alloy containing at least one of these elements. Through changes in the combination or composition of these elements, the second magnetic layer 65 is made to have a higher coercive force than the first magnetic layer 63. For example, materials such as Co, NiFe, NiFeCo, FeCo, and CoFeB are used to form these magnetic layers. Also, the first magnetic layer 63 or second magnetic layer 65 may consist of two or more layers. For example, a two-layered structure—a stack of a 5-nm thick Co layer and 30-nm thick FeMn layer—may be used for the second magnetic layer 65.

The first magnetic layer 63 and second magnetic layer 65 may be formed in the opposite order. That is, the layers may be stacked in this order: lower sense line 62, the second magnetic layer 65, non-magnetic layer 64, and the first magnetic layer 63. The thicknesses of the first magnetic layer 63 and second magnetic layer 65 are preferably within the range of 2 to 100 nm.

As a material for the non-magnetic layer 64, an insulator is used. Then electrons move between magnetic layers, tunneling through the insulator, and GMR is produced relying on the differences in the state densities of spin electrons.

In other words, when the magnetization directions of the magnetic layers are parallel, up-spin electrons can tunnel to the other magnetic layer freely and assume there an up-spin state and down-spin electrons can tunnel freely to the other magnetic layer and assume there a down-spin state, reducing the differences in the state densities of spin electrons, which in turn lowers the resistance.

In contrast, when the magnetization directions of the magnetic layers are anti-parallel, neither up-spin nor down-spin electrons can tunnel, increasing the differences in the state densities of spin electrons, which in turn raises the resistance.

As the insulator, oxides or nitrides of Al, Si, Cu, Mg, etc. are used, among which aluminum oxides that have Fermi levels close to those of the other magnetic layers are more preferably used. The thickness of the non-magnetic layer is between 0.5 and 5 nm. Depending on the method of film formation, a film thinner than 0.5 nm will grow in an island-like fashion, which may result in pinhole formation. In case of such pinhole formation, the interaction between the first and second magnetic layers may suppress MR ratio. On the other hand, if the non-magnetic layer is thicker than 5 nm, the gap between the two magnetic layers becomes too large with respect to the mean free path of electrons. This will lower the probability of tunneling, which in turn will result in reduced MR ratio.

The magnetoresistive film 66 consisting of the first magnetic layer 63, non-magnetic layer 64, and second magnetic layer 65 functions as a memory cell and its joint area is determined, as required, depending on the processes used and the film's intended applications. Since the resistivity standardized for the area of a magnetoresistive film is on the order of $10^{-5}$ $\Omega cm^2$, a preferable area is 1 $\mu m^2$ or less, which is suitable for the ON-state resistance value (several kiloohms) of the transistor that drives the memory cell.

The drain region 72 of the field-effect transistor 73 is connected electrically to one end of the lower sense line 62. The lower sense line 62 is made of a material with high electrical conductivity, desirably a metal film such as Al, Cu, or Au. Here, the thickness of the lower sense line 62 is very important. Selecting the thickness of the lower sense line 62 in the range between 1 and 50 nm will make it possible to achieve a high S/N ratio and low power consumption for the memory device.

The thickness less than 1 nm will raise the electrical resistance and degrade the S/N ratio of the entire circuit. The thickness above 50 nm will lower the MR ratio, and thus the S/N ratio. The results of experiments repeated by varying the thickness of the lower sense layer showed that preferable thickness is in the range between 5 and 20 nm.

To make a more detailed study, similar procedures were repeated by using lower sense layers (62) 5 to 20 nm thick in increments of 1 nm and it was found that more preferable thickness is between 6 and 9 nm. This was against our expectation that the best results would be obtained with the critical thickness of 2 nm where the island-like growth stops.

In the magnetoresistive film 66, described above, an upper sense line 67 is formed, in the direction perpendicular to the drawing. Then a word line (writing ray) 69 is formed on the upper sense line 67 with an insulating layer 68 interposed between them. To pass read and write currents, the upper sense line 67 and word line 69 are made of a material with high electrical conductivity, desirably a metal film such as Al, Cu, or Au. The thicknesses of the upper sense line 67 and word line 69, which depend on the magnitude of the currents and the line width, is preferably within the range of 100 to 1000 nm. The insulating layer 68 is formed of non-organic material such as $SiO_2$, SiN, or $Al_2O_3$, or organic material such as novolac resin. The thickness of the insulating layer 68, which depends on the withstand voltage necessary to withstand the power applied to the upper sense line 67 or word line 69, is normally within the range of 5 to 1000 nm.

Although not used in FIG. 18, a buffer layer may be provided between the lower sense line 62 and magnetoresistive film 66 to adjust the free surface energy between the two layers and achieve a highly flat interface structure. As a material for such a buffer layer, metals such as Ta, Cu, and Cr, or insulating materials such as SiN, $SiO_2$, or $Al_2O_3$ are used. More preferably Ta or SiN is used. The thickness of the buffer layer should preferably be within the range of 2 to 10 nm. Depending on the method of film formation, a film thinner than 2 nm will grow in an island-like fashion, which may result in uneven film properties while a film thicker than 10 nm may lower productivity.

In the embodiment shown in FIG. 18, the magnetoresistive film 66 under the upper sense line 67 and word line 69 constitutes a memory cell, an elementary unit of storage that stores one bit of information. Either "0" or "1" is written selectively into this memory cell depending on the direction of the current flowing through the word line 69 in a manner similar to the method described with reference to FIGS. 2A and 2B. For example, "0" is written when an electric current is passed through the word line 69 perpendicularly out of the drawing, and "1" is written when a current is passed perpendicularly into the drawing. The relationship between the direction of current and the information written (i.e., "0" or "1") may be the other way around.

The field-effect transistor 73 can be used for switching during writing. The source region 70 of the field-effect transistor 73, gate electrode 75 of the field-effect transistor 73, and upper sense line 67 are electrically connected with terminals 76, 77, and 78, respectively. When a voltage is applied between the terminals 76 and 78 and a voltage is applied to the terminals 77, the field-effect transistor 73 is activated and a current flows through the magnetoresistive film 66. The current values may be set in such a way that information is recorded only when the magnetic fields generated by the individual currents are superposed, i.e., when a write current passes through the word line 69 while a current is flowing through the magnetoresistive film 66. In that case, passage of current through the word line 69 alone will not cause information to be written if no current is flowing through the magnetoresistive film 66 with the field-effect transistor 73 being off. In other words, it is possible to control writing of information by turning on and off the field-effect transistor 73.

The information written into the GMR memory device of FIG. 18 can be read out in a manner similar to that described with reference to FIGS. 3A, 3B, 4A and 4B. When the field-effect transistor 73 is activated by the application of a fixed voltage between terminals 76 and 78, a read current flows through the magnetoresistive film 66. In this state if an AC regenerative pulse current that changes its direction temporally is applied to the word line 69, the current flowing between the terminals 76 and 78 varies due to changes in the resistance value of the magnetoresistive film 66. By looking at whether the current changes from large to small or from small to large, it is possible to recognize whether the written information is "0" or "1".

The GMR memory device shown in FIG. 18 can be fabricated by a known micropatterning process exemplified by photolithography. Also, the lower sense line, first and second magnetic layers, non-magnetic layer, upper sense line, insulating layer, and word line can be formed by known processes such as vapor deposition, sputtering, and molecular-beam epitaxy (MBE).

FIG. 18 shows an example where the first magnetic layer 63 of the magnetoresistive film 66 is formed over the entire area of the lower sense line 62. However, since it is only the portion formed at the intersection (overlapping portion) of the lower sense line 62 and upper sense line 67 that functions as a memory cell, the rest of the magnetoresistive film can be removed. An example is shown in FIGS. 19 and 20.

Figure 19:
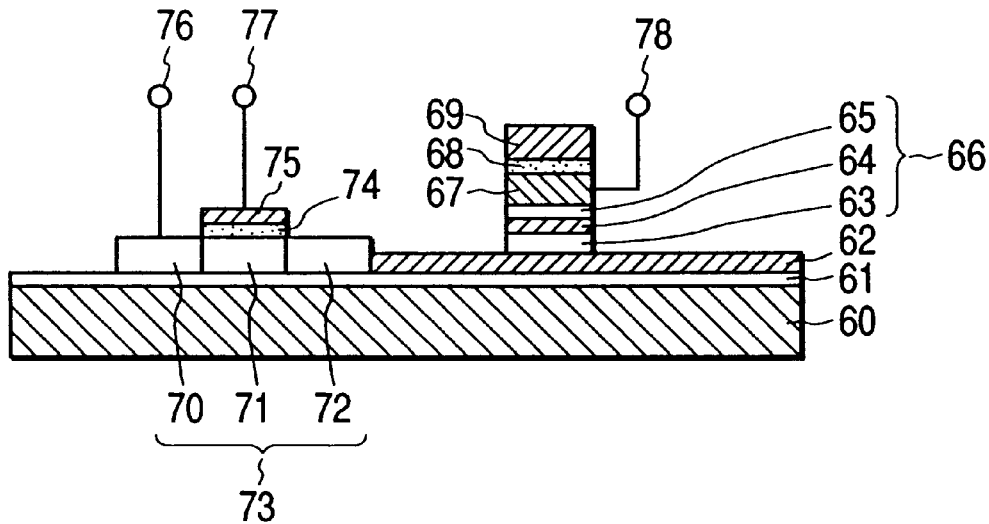
FIGS. 19 and 20 are a schematic sectional view and a schematic perspective view showing the eighth embodiment of the GMR memory device according to the present invention.
Figure 20:
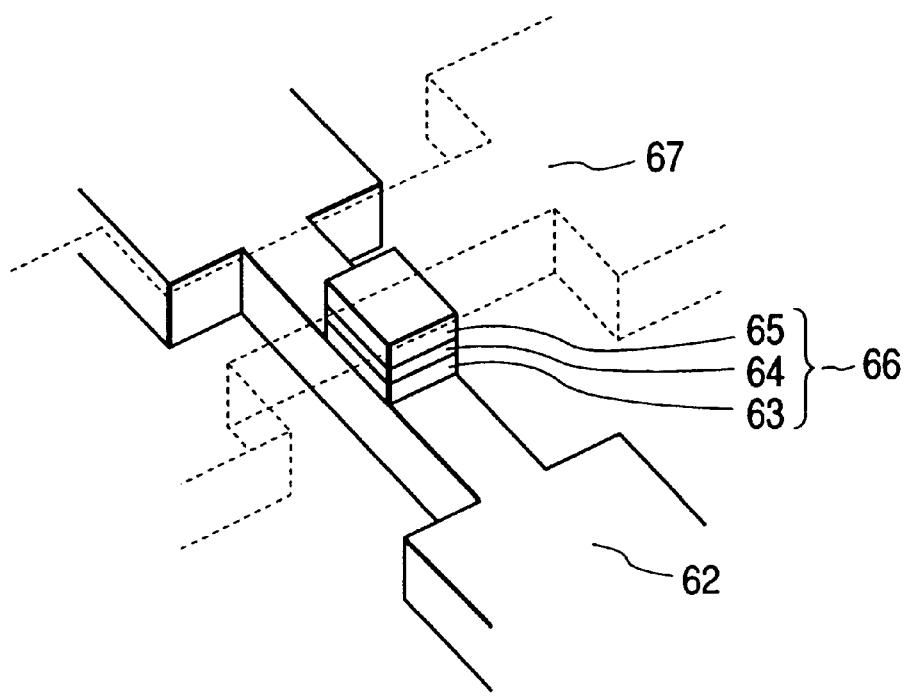

FIGS. 19 and 20 show the eighth embodiment of the GMR memory device according to the present invention. FIG. 19 is a schematic sectional view while FIG. 20 is a schematic perspective view. In FIGS. 19 and 20, the same parts as those in FIG. 18 are designated by the same reference numerals and descriptions thereof are omitted. In this embodiment, the magnetoresistive film 66 is formed at the intersection of the lower sense line 62 and upper sense line 67 in such a way that current flows perpendicular to the surface of the magnetoresistive film 66, as shown in FIG. 20.

Figure 22:
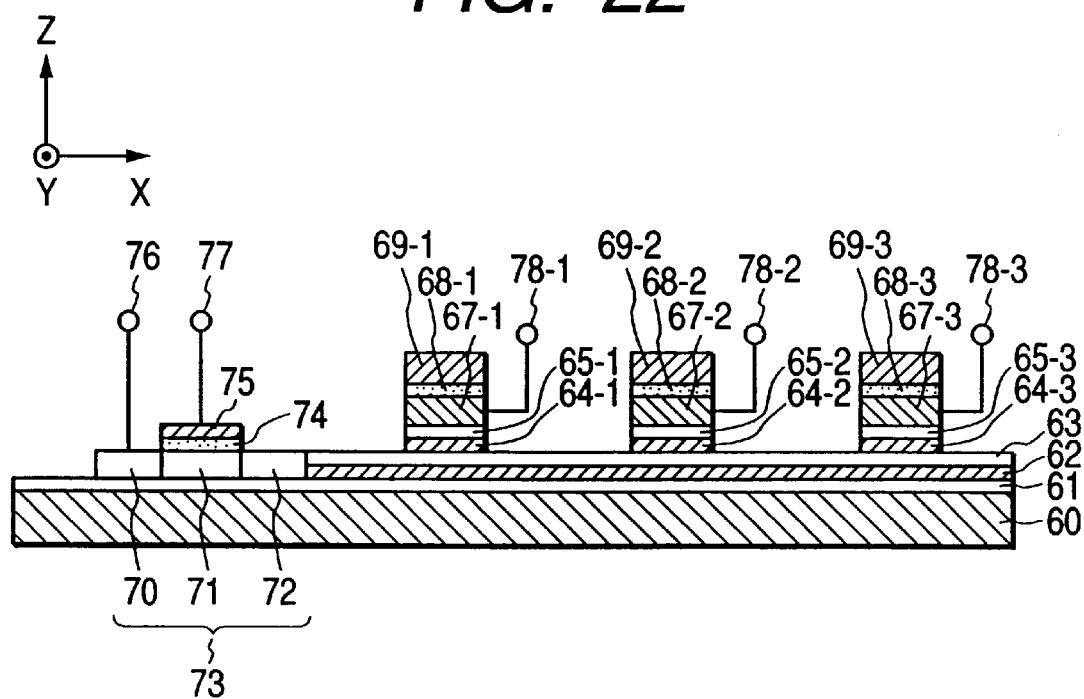
FIG. 22 is a schematic sectional view showing the ninth embodiment of the GMR memory device according to the present invention.

In the configuration of FIG. 18, memory cells can be arranged in an M×N matrix on an SOI substrate (M and N are integers equal to or larger than 2), as is the case with the embodiment described in FIGS. 7 to 9. An example is shown in FIG. 22, which is a schematic sectional view along the X direction corresponding to FIG. 8 shown in relation to the second embodiment and represents the ninth embodiment of the GMR memory device according to the present invention. In FIG. 22, the same parts as those in FIG. 18 are designated by the same reference numerals and descriptions thereof are omitted.

The embodiment of FIG. 22 shows an example where three memory cells are formed side by side on the lower sense line 62. Each memory cell is composed of a non-magnetic layer 64-1, 64-2, or 64-3 and second magnetic layer 65-1, 65-2, or 65-3 formed on the common first magnetic layer 63. An upper sense line 67-1, 67-2, or 67-3 is formed in each magnetoresistive film. The upper sense lines 67-1, 67-2, and 67-3 are connected with terminals 78-1, 78-2, and 78-3, respectively. Besides, word lines 69-1, 69-2, and 69-3 are formed on the upper sense lines 67-1, 67-2, and 67-3 with insulating layers 68-1, 68-2, and 68-3 interposed between them.

Figure 21:
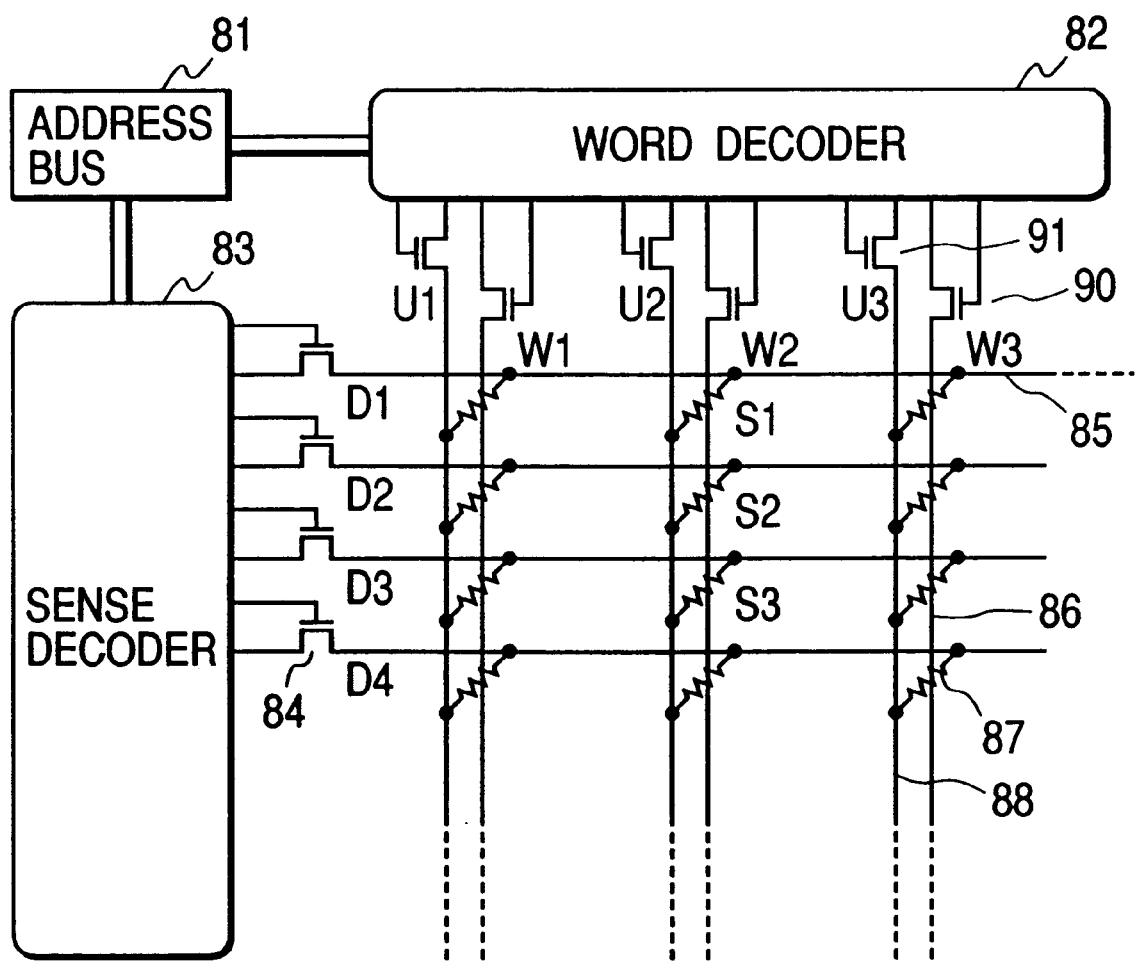
FIG. 21 is a circuit diagram of a memory unit employing the eighth embodiment of the GMR memory device.

FIG. 21 is a circuit diagram of a memory unit employing the eighth embodiment of the GMR memory device shown in FIG. 22. It shows only the area necessary for explanation of the operation and the rest of the circuit is omitted. The address signal that specifies the cell to execute a read/write operation is sent to the sense decoder 83 and word decoder 82 through the address bus 81. The sense decoder 83 serves to detect resistance changes in the sense line as well as to determine where to connect the lower sense line 85 stretching horizontally across the drawing and control the gate of the switching transistor 84.

The word decoder 82 serves to deliver current to the word line 86 and control the values of the current that correspond to read/write operations as well as to determine where to connect the word line 86 stretching vertically across the drawing and control the gate of the switching transistor 90.

It also determines where to connect the upper sense line 88 and controls the gate of the switching transistor 91. Directly under the intersection of the upper and lower sense lines (85 and 88) is a memory cell 87 consisting of a magnetic layer, non-magnetic layer, and magnetic layer. Memory cells are represented by resistors on the drawing. The word line 86 is located right above the intersection of the sense lines. There is an insulating film between the word line 86 and upper sense line 88 to prevent them from connecting electrically.

Now a description will be given of how to write information into a memory cell, taking the cell S3 as an example. First, the address bus 81 sends an address signal to the sense decoder 83 and word decoder 82, instructing them to select the cell S3. Upon receipt of the instruction, the sense decoder 83 selects the lower sense line D3 by sending an activation command to the gate of the switching transistor and applies a sense current to the lower sense line D3.

On the other hand, the word decoder 82, upon receipt of the instruction, selects the upper sense line U2 by sending an activation command to the gate of the switching transistor of the upper sense line U2 and ensures that the sense current supplied to the lower sense line D3 will reach the upper sense line U2 through the memory device consisting of a first magnetic layer, non-magnetic layer, and second magnetic layer.

Also, the word decoder 82, upon receipt of the instruction, selects the word line W2 by sending an activation command to the gate of the switching transistor of the word line W2 and supplies a word current to the word line W2.

Since the word current is in write mode at this time, a current larger than the word current used for reading is applied. In this way, the resultant magnetic field composed of the superposed magnetic fields generated by the current applied to the word line W2 and the sense current flowing through the lower sense line D3 and upper sense line U2 are applied to the cell S3 located directly under the lower sense line D3 and upper sense line U2. The resultant magnetic field generated is large enough to reverse not only the magnetization direction of the read layer, but also the magnetization direction of the write layer that stores information.

Therefore, either "0" or "1" is written according to the direction of the word line current at the given time. By the application of similar procedures to all the cells, information is written into the entire memory area quickly and nondestructively.

Now a description will be given of how to read information out of a memory cell, taking the cell S3 as an example. First, the address bus 81 sends an address signal to the sense decoder 83 and word decoder 82, instructing them to select the cell S3. Upon receipt of the instruction, the sense decoder 83 selects the lower sense line D3 by sending an activation command to the gate of the switching transistor and applies a sense current to the lower sense line D3.

On the other hand, the word decoder 82, upon receipt of the instruction, selects the upper sense line U2 by sending an activation command to the gate of the switching transistor of the upper sense line U2 and ensures that the sense current supplied to the lower sense line D3 will reach the upper sense line U2 through the memory device consisting of a first magnetic layer, non-magnetic layer, and second magnetic layer.

Also, the word decoder 82, upon receipt of the instruction, selects the word line W2 by sending an activation command to the gate of the switching transistor of the word line W2 and supplies a word current to the word line W2. Since the word current is in read mode at this time, a current smaller than the word current used for writing is applied.

In this way, the resultant magnetic field composed of the superposed magnetic fields generated by the current applied to the word line W2 and the sense current flowing through the lower sense line D3 and upper sense line U2 are applied to the cell S3 located directly under the lower sense line D3 and upper sense line U2.

The resultant magnetic field generated is large enough to reverse the magnetization direction of the read layer although the magnetization direction of the write layer that stores information remains fixed. Therefore, information can be read out through the detection of resistance variations by sorting the directions of the sense current into two directions with the sense decoder according to the type of recorded information: "0" or "1". By the application of similar procedures to all the cells, information is read out of the entire memory area quickly and nondestructively.

A concrete example is presented below.

EXAMPLE 5

A GMR memory device of the configuration shown in FIG. 22 was fabricated. It was a 64 bit GMR memory device made up of 2 $\mu$m square memory cells arranged in an 8×8 matrix. It contained eight each magnetoresistive films and word lines. The SOI substrate used was an 8-inch substrate fabricated by the method described in U.S. Pat. No. 5,371,037 cited earlier.

The thickness of the monocrystalline silicon layer was 100 nm. The crystal orientation was 100 and the crystal had a lightly doped n-shape. The $SiO_2$ insulating layer was 1 $\mu$m thick. The substrate was patterned by photolithography and the areas for film formation and milling were defined by a resist mask.

To prevent impurity elements from mixing, the semiconductor processes other than the magnetoresistive film process were carried out first and the substrate was covered with a protective film.

Sputtering equipment was used for the formation of the magnetoresistive films. The lower sense line (Al), first magnetic layer ($Ni_{80}Fe_{20}$), non-magnetic layer ($AlO_x$), second magnetic layer (Co), insulating layer (SiN), upper sense line (Al), and word line (Al) were formed with the ultimate pressure set at less than $5 \times 10^{-5}$ Pa.

The Al films for the lower sense line (Al) were varied in the range between 0.5 and 100 nm to fabricate sample. The other film thicknesses were fixed: first magnetic layer ($Ni_{80}Fe_{20}$) is 25 nm, non-magnetic layer ($AlO_x$) is 1.2 nm, second magnetic layer (Co) is 25 nm, upper sense line (Al) is 50 nm, insulating layer (SiN) is 110 nm, and word line (Al) is 50 nm.

The first magnetic layer made of soft magnetic material functions as the read (reproducing) layer, and the second magnetic layer made of hard magnetic material functions as the write (memory) layer. To form the non-magnetic layer ($AlO_x$), first Al was sputtered, then oxygen was introduced into the chamber, and the Al was left under 1000 Pa for 125 minutes to form an aluminum oxide film ($AlO_x$). After the oxide film was formed, the chamber was evacuated to the ultimate pressure for the next film formation step. During the film formation, permanent magnets were placed to provide an equal magnetic anisotropy in the direction of the substrate surface. The magnetic field intensity generated by the permanent magnets was 20 Oe at the center of measurement.

Actual element patterns were formed by ion milling and lift-off.

The characteristics of the 64-bit memory device thus produced were evaluated by issuing access signals. An all-around assessment was made considering S/N ratio, power consumption, access speed, access performance, and stability as memory, and the results are shown in Table 3. Good characteristics were obtained when the thickness of the lower sense layer was between 1 and 50 nm. Among others, the best results were obtained when the thickness was between 5 and 20 nm.

Based on the above results, similar procedures were repeated by using lower sense layers 5 to 20 nm thick in increments of 1 nm to make a more detailed study and the results are shown in Table 4. It was found that more preferably the thickness of the lower sense layer should be between 6 and 9 nm. The thickness above 50 nm resulted in a low MR ratio, and thus a low S/N ratio.

On the other hand, a film thinner than 0.5 nm resulted in an increased resistance, and thus a low S/N ratio, probably because of island-like growth. It was found that the samples with degraded S/N ratio was not suitable for high speed drive because of unstable memory operation.

TABLE 3

The relationship between the thickness of the
lower sense layer and memory performance (○: very good;
Δ: good; X: poor)

| Film thickness (nm) | 0 | 0.5 | 1 | 5 | 15 | 20 | 25 | 30 | 35 | 40 | 45 | 50 | 55 | 60 |
|---|---|---|---|---|---|---|---|---|---|---|---|---|---|---|
| Performance | X | X | Δ | ○ | ○ | ○ | Δ | Δ | Δ | Δ | Δ | Δ | X | X |

| Film thickness (nm) | 65 | 70 | 75 | 80 | 85 | 90 | 95 | 100 |
|---|---|---|---|---|---|---|---|---|
| Performance | X | X | X | X | X | X | X | X |

TABLE 4

The relationship between the thickness of the
lower sense layer and memory performance (⊙: very good;
○: good)

| Film thickness (nm) | 5 | 6 | 7 | 8 | 9 | 10 | 11 | 12 | 13 | 14 | 15 | 16 | 17 | 18 |
|---|---|---|---|---|---|---|---|---|---|---|---|---|---|---|
| Performance | ○ | ⊙ | ⊙ | ⊙ | ⊙ | ○ | ○ | ○ | ○ | ○ | ○ | ○ | ○ | ○ |

| Film thickness (nm) | 19 | 20 |
|---|---|---|
| Performance | ○ | ○ |

Figure 23:
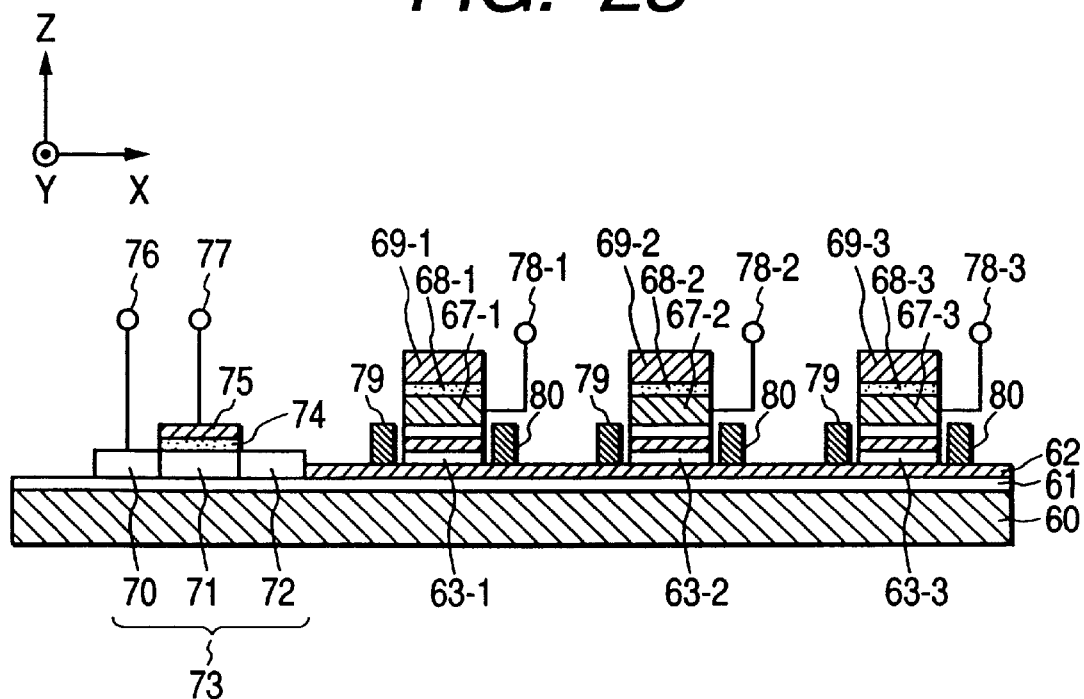
FIG. 23 is a schematic sectional view showing the tenth embodiment of the GMR memory device according to the present invention.

FIG. 23 is a schematic sectional view along the X direction corresponding to FIG. 8 shown in relation to the second embodiment and represents the tenth embodiment of the GMR memory device according to the present invention. In FIG. 23, the same parts as those in FIG. 22 are designated by the same reference numerals and descriptions thereof are omitted.

The embodiment of FIG. 23 shows an example where three memory cells are formed side by side on the lower sense line 62. The difference from the ninth embodiment shown in FIG. 22 is that the first magnetic layers 63-1, 63-2, and 63-3 are formed separately in each memory cell rather than as lines spreading in the X direction and that magnetic-field concentrating layers 79 and 80 were placed on both sides of each memory cell to concentrate the magnetic fields generated by the word lines on the memory cells.

A concrete example is presented below.

EXAMPLE 6

A GMR memory device of the configuration shown in FIG. 23 was fabricated. It was a 64 bit GMR memory device made up of 2 μm square memory cells arranged in an 8×8 matrix. It contained eight each magnetoresistive films and word lines. The SOI substrate used was an 8-inch substrate fabricated by the method described in U.S. Pat. No. 5,371,037 cited earlier.

As shown in FIG. 23, magnetic-field concentrating layers 79 and 80 were placed around each of the three cells. In this example, magnetic-field concentrating layers were made of a 100-nm wide, 50-nm high FeN film and placed 2 μm away from both sides of each memory cell with an area of 4 μm².

Then the characteristics of the GMR memory device, whose configuration was the same as in Example 5 except for the magnetic-field concentrating layers, were measured.

An all-around assessment was made considering S/N ratio, power consumption, access speed, access performance, and stability as memory, and the results were the same as in Example 5. Good characteristics were obtained when the thickness of the lower sense layer was between 1 and 50 nm. Among others, the best results were obtained when the thickness was between 5 and 20 nm. The thickness above 50 nm resulted in a low MR ratio, and thus a low S/N ratio.

On the other hand, a film thinner than 0.5 nm resulted in an increased resistance, and thus a low S/N ratio, probably because of island-like growth. It was found that the samples with degraded S/N ratio was not suitable for high speed drive because of unstable memory operation.

In the seventh and tenth embodiments described above, a lower sense layer of a metal film was formed in the area where a monocrystalline silicon layer was removed. However, if doped with an impurity, the monocrystalline silicon layer can be used as lower sense lines. An example is shown below.

Figure 24:
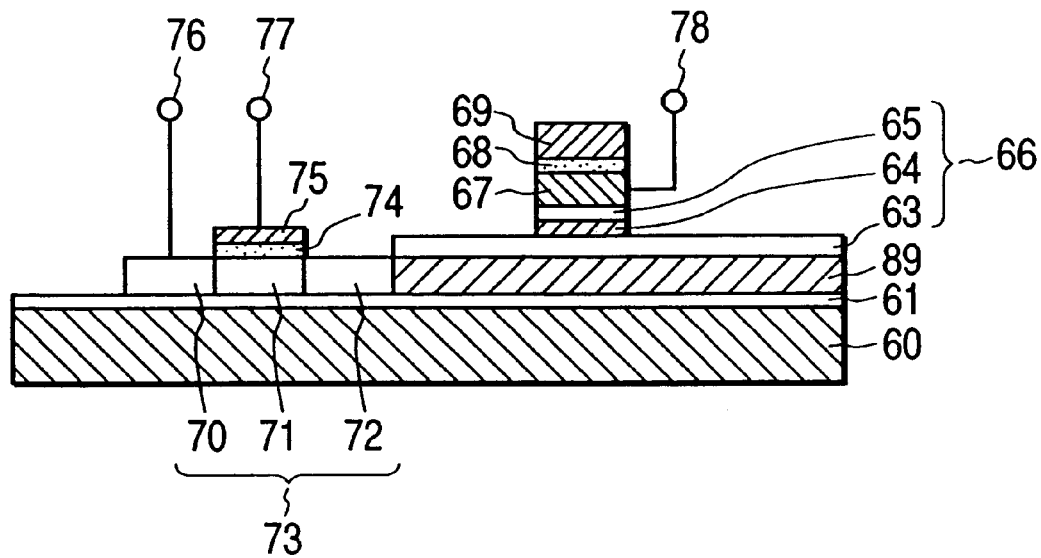
FIG. 24 is a schematic sectional view showing the eleventh embodiment of the GMR memory device according to the present invention.

FIG. 24 shows the eleventh embodiment of the GMR memory device according to the present invention. This embodiment is characterized in that a lower sense line 89 formed from a monocrystalline silicon layer doped with an impurity is used instead of the lower sense line 62 used in the seventh embodiment shown in FIG. 18. Otherwise, the GMR memory device is formed in exactly the same manner as in the seventh embodiment. In FIG. 24, the same parts as those in FIG. 18 are designated by the same reference numerals and descriptions thereof are omitted.

This embodiment provides a memory device with a high S/N ratio and low power consumption, completely eliminating the sensitivity of the lower sense line 89 to film thickness, by using a monocrystalline silicon layer of an SOI substrate patterned after impurity doping as the lower sense line 89 instead of fabricating it through film formation.

The impurity doping of the monocrystalline silicon layer was performed with ion implantation equipment. Since the ions implanted are doped for the purpose of increasing the electrical conductivity of the monocrystalline silicon layer, the impurity element used may be either the p-type or n-type. Specifically, P, B, Ge, As, S, Cl, C, or the like is used. A lightweight p-type element such as B tends to increase the diffusion area because of the wide range of its particles. Since it is difficult to lower the implantation energy sufficiently to form weak bonds, a heavy n-type element such as arsenic (As) is recommended. The amount of impurity introduced should be $10^{14}$ cm$^{-2}$ or more to lower the sheet resistance sufficiently.

To use the doped monocrystalline silicon layer as the lower sense layer 89, it is necessary to remove the unnecessary portion of the monocrystalline silicon layer by patterning so that current will be supplied only to where it is necessary. To the patterning of the monocrystalline silicon layer, various microfabrication techniques may be applied. As an illustration, the monocrystalline silicon layer may be masked by photolithography, and then unnecessary portion of the monocrystalline silicon layer may be removed by dry etching with $CF_4$. Only the portion to be removed is affected by etching, the rest, the main portion, is unaffected because of the masking.

Moreover, since a monocrystalline silicon layer is highly flat, the interface between the magnetic layers and non-magnetic layer formed on it is also kept flat. Therefore, the interface is relatively free from scattering, spins are conserved, and an MR ratio high enough for tunneling between magnetic layers is obtained.

Furthermore, since the electrical conductivity of the monocrystalline silicon layer can be controlled easily by the amount of doping, it is possible to achieve the optimum wiring resistance according to the characteristics required of the circuit.

The thickness of the monocrystalline silicon layer is selected within the range between 50 and 100 nm, as required, depending on the specifications for the characteristics of the switching transistor and the specifications for the functions of the lower sense line.

Figure 25:
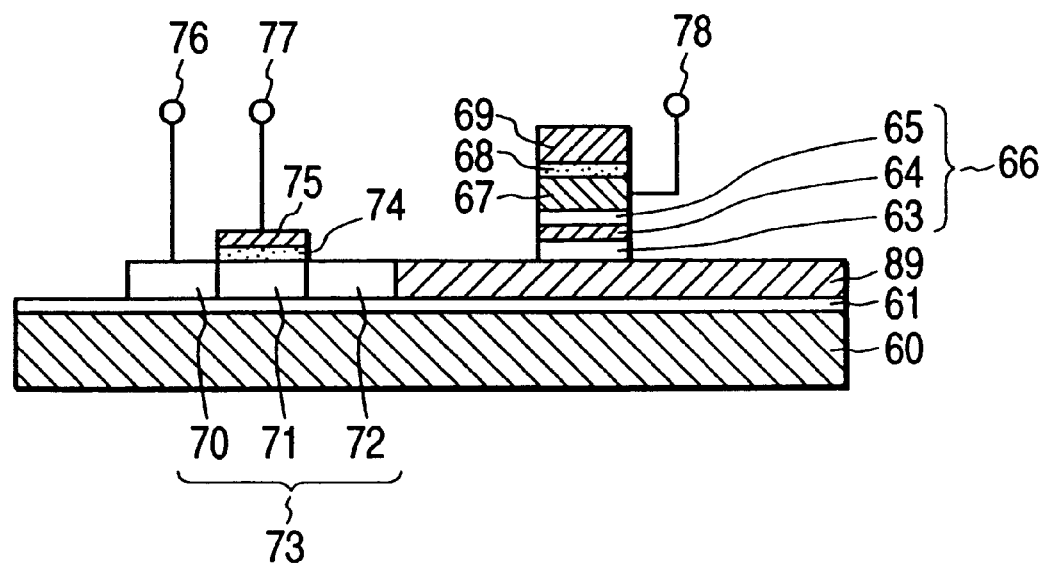
FIG. 25 is a schematic sectional view showing the twelfth embodiment of the GMR memory device according to the present invention.

FIG. 25 shows the twelfth embodiment of the GMR memory device according to the present invention. This embodiment is characterized in that a lower sense line 89 formed from a monocrystalline silicon layer doped with an impurity is used instead of the lower sense line 62 used in the eighth embodiment shown in FIG. 19. Otherwise, the GMR memory device is formed in exactly the same manner as in the eighth embodiment. In FIG. 25, the same parts as those in FIG. 19 are designated by the same reference numerals and descriptions thereof are omitted.

Figure 26:
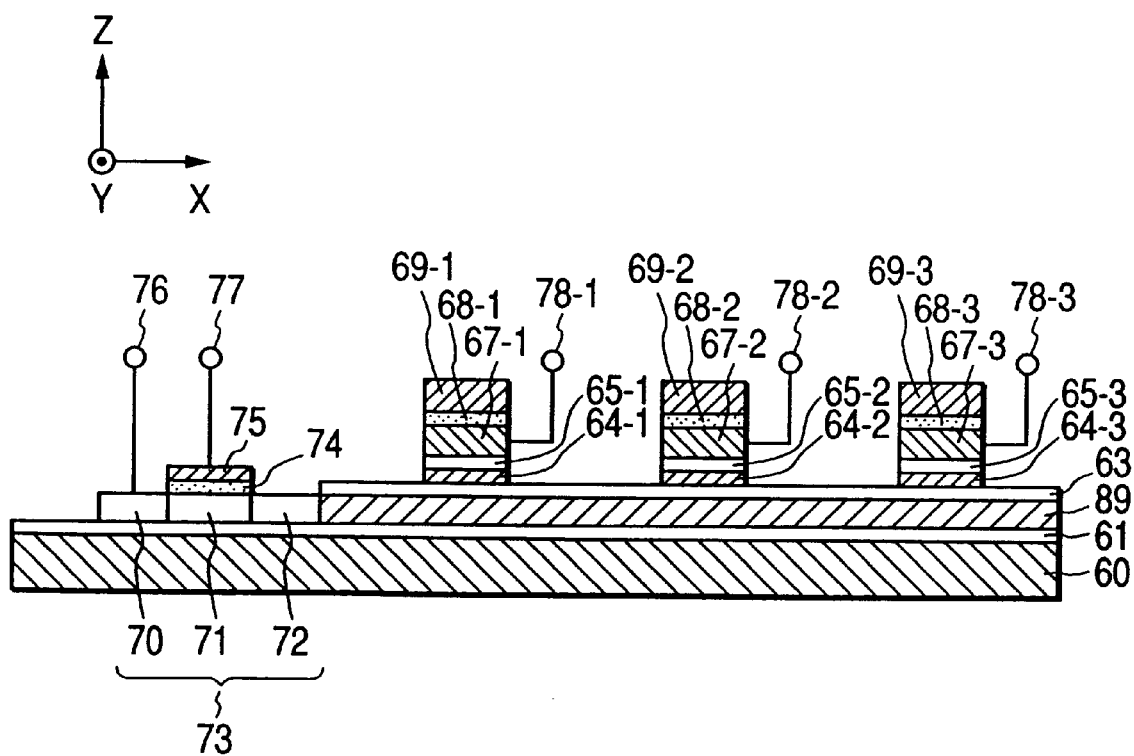
FIG. 26 is a schematic sectional view showing the thirteenth embodiment of the GMR memory device according to the present invention.

FIG. 26 shows the thirteenth embodiment of the GMR memory device according to the present invention. This embodiment is characterized in that a lower sense line 89 formed from a monocrystalline silicon layer doped with an impurity is used instead of the lower sense line 62 used in the ninth embodiment shown in FIG. 22. Otherwise, the GMR memory device is formed in exactly the same manner as in the eighth embodiment. In FIG. 26, the same parts as those in FIG. 22 are designated by the same reference numerals and descriptions thereof are omitted.

A concrete example is presented below.

EXAMPLE 7

A GMR memory device of the configuration shown in FIG. 26 was fabricated. It was a 64 bit GMR memory device made up of 2 μm square memory cells arranged in an 8×8 matrix. It contained eight each magnetoresistive films and word lines. The SOI substrate used was an 8-inch substrate fabricated by the method described in U.S. Pat. No. 5,371,037 cited earlier. The thickness of the monocrystalline silicon layer was 100 nm. The crystal orientation was 100 and the crystal had a lightly doped n-shape. The $SiO_2$ layer was 1 μm thick.

The substrate was patterned by photolithography and the areas for film formation and milling were defined by a resist mask. To prevent impurity elements from mixing, the semiconductor processes other than the magnetoresistive film process were carried out first and the substrate was covered with a protective film.

To form the lower sense line 89, after the pattern formation by means of photolithography, the quality of the monocrystalline silicon layer was improved by implantation of arsenic, which is an n-type impurity. Regarding the conditions of implantation, the implantation energy was 80 KeV and dosage was $1×10^{14}/cm^2$. Since the mass number of arsenic is as large as 75, which means a small range, implantation can be performed sufficiently even into a monocrystalline silicon layer as thin as 100 nm. Moreover, activation by heat treatment at 900° C. made it possible to achieve sufficient sheet resistance to use the monocrystalline silicon layer as a lower sense layer.

Sputtering equipment was used for film formation. With the ultimate pressure set at less than $5×10^{-5}$ Pa, the first magnetic layer (63) was formed of $Ni_{80}Fe_{20}$, the non-magnetic layer (64-1, 64-2, and 64-3), $AlO_x$; the second magnetic layer (65-1, 65-2, and 65-3), Co; the upper sense line (67-1, 67-2, and 67-3), Al; the insulating layer (68-1, 68-2, and 68-3), SiN; and the word line (69-1, 69-2, and 69-3)—Al. As to film thickness, first magnetic layer (63) of $Ni_{80}Fe_{20}$ ($Ni_{80}Fe_{20}$) was 25 nm, non-magnetic layer (64-1, 64-2, and 64-3) of $AlO_x$ was 1.2 nm, second magnetic layer (65-1, 65-2, and 65-3) of Co was 25 nm, upper sense line (67-1, 67-2, and 67-3) of Al was 50 nm, insulating layer (68-1, 68-2, and 68-3) of SiN was 110 nm, and word line (69-1, 69-2, and 69-3) of Al was 50 nm. The first magnetic layer (63) made of soft magnetic material functions as the read (reproducing) layer, and the second magnetic layer (65-1, 65-2, and 65-3) made of hard magnetic material functions as the write (memory) layer. To form the non-magnetic layer (64-1, 64-2, and 64-3) of $AlO_x$, first Al was sputtered, then oxygen was introduced into the chamber, and the Al was left under 1000 Pa for 125 minutes to form an aluminum oxide film ($AlO_x$). After the oxide film was formed, the chamber was evacuated to the ultimate pressure for the next film formation step. During the film formation, permanent magnets were placed to provide an equal magnetic anisotropy in the direction of the substrate surface. The magnetic field intensity generated by the permanent magnets was 20 Oe at the center of measurement.

Actual element patterns were formed by ion milling and lift-off.

In addition to the 64-bit memory device thus produced, a memory device was produced as a control sample by exactly the same processes except the fabrication process of the lower sense layers. By the use of sputtering equipment as was the case with magnetoresistive films, lower sense layers 25 nm thick were formed of aluminum with the ultimate pressure set at less than $5\times10^{-5}$ Pa. Both samples were evaluated by issuing access signals.

A constant sense current of 1 mA was supplied to the upper and lower sense lines and changes in the tunnel resistance were captured as voltage variations on an oscilloscope. A four-probe method was used for detecting voltage in order to eliminate the effects of any residual resistance in lead wires or any contact resistance between the pad and probe. A 1-msec wide square wave signal having a period of 20 msec was input to the word lines, and information was read and written by using the resultant magnetic field of the magnetic field generated in accordance with the word line signal and the magnetic field generated by the constant sense current. Word currents were determined and set as follows: for magnetic layers made of NiFe and Co, the magnetization intensity at which the magnetization direction changes was determined with an MR evaluator that had an external magnetic-field generator, and the word current which corresponded to that magnetization intensity was determined through simulation.

An all-around assessment was made considering S/N ratio, power consumption, access speed, access performance, and stability as memory, and it was found that the memory device employing a doped Si layer as its lower sense layer had equivalent characteristics as the control sample employing a sputtered lower sense layer. With regard to the signal level due to MR ratio, the memory device with the doped Si layer had a higher level. This could be explained as follows: since the lower sense layer made of the Si layer doped with impurity was highly flat, the interface between the magnetic layers and non-magnetic layer formed on it was also kept flat, and thus the interface was relatively free from scattering, spins were conserved, and an MR ratio high enough for tunneling between magnetic layers was obtained.

In the eleventh to thirteenth embodiments described above, the memory devices are fabricated by known semiconductor processes as is the case with the seventh to tenth embodiments. Also, information is written into and read out of the memory cell in exactly the same manner as in the embodiment described with reference to FIG. 21.

Although the invention has been described herein with reference to specific embodiments, many modifications and variations are possible within the scope of the present invention. For example, instead of the monocrystalline silicon layer formed on the insulating layer, a layer made of another monocrystalline semiconductor such as GaAs may be used. Such a monocrystalline semiconductor layer may be formed not only on an insulating layer on a silicon substrate, but also on a substrate, such as glass substrate, which consists entirely of an insulating material. In other words, the monocrystalline semiconductor may be anything provided it is formed on a substrate with an insulating surface.

Besides, instead of the field-effect transistor connected to the magnetoresistive film and word line as described with reference to the preferred embodiments above, any element may be used, provided that it functions as a switching element.

All such modifications and variations are to be understood as included within the scope of the present invention as defined by the appended claims unless they depart therefrom.

What is claimed is:

1. A memory device utilizing giant magnetoresistance effect and comprising:
   a substrate with an insulating surface;
   a monocrystalline semiconductor layer formed on the insulating surface of said substrate;
   a switching element formed at least on part of said monocrystalline semiconductor layer;
   a magnetoresistive film formed on the insulating surface of said substrate, said magnetoresistive film consisting of a first magnetic layer and a second magnetic layer which has a higher coercive force than the first magnetic layer and which is stacked on the first magnetic layer with a non-magnetic layer interposed between them; and
   a word line installed near said magnetoresistive film with an insulating layer interposed between them, wherein said switching element is connected electrically to either the magnetoresistive film or word line.

2. The memory device according to claim 1, wherein the thickness of said monocrystalline semiconductor layer is in the range of 50 to 500 nm.

3. The memory device according to claim 2, wherein the thickness of said monocrystalline semiconductor layer is in the range of 50 to 250 nm.

4. The memory device according to claim 3, wherein the thickness of said monocrystalline semiconductor layer is in the range of 60 to 120 nm.

5. The memory device according to claim 1, further comprising a buffer layer installed between the insulating surface of said substrate and magnetoresistive film.

6. The memory device according to claim 1, wherein said word line is installed between the insulating surface of said substrate and magnetoresistive film.

7. The memory device according to claim 1, further comprising a lower sense line installed between the insulating surface of said substrate and magnetoresistive film, and an upper sense line installed on said magnetoresistive film, wherein the non-magnetic layer of said magnetoresistive film is made of an insulating material.

8. The memory device according to claim 7, wherein said word line is installed on said upper sense line, separated by an insulating layer.

9. The memory device according to claim 7, wherein the thickness of said lower sense line is in the range of 1 to 50 nm.

10. The memory device according to claim 9, wherein the thickness of said lower sense line is in the range of 5 to 20 nm.

11. The memory device according to claim 7, wherein said lower sense line is formed by impurity doping on part other than the part where the switching element of said monocrystalline semiconductor layer is formed.

12. The memory device according to claim 1, wherein said substrate with an insulating surface comprises a $SiO_2$ layer formed on a silicon substrate.

13. The memory device according to claim 12, wherein said monocrystalline semiconductor layer comprises a monocrystalline silicon layer formed on said $SiO_2$ layer.

14. The memory device according to claim 1, wherein said switching element comprises a field-effect transistor comprising a source region, gate region, and drain region.

15. The memory device according to claim 1, further comprising magnetic-field concentrating layers made of a high-permeability material and installed near said magnetoresistive film to concentrate the magnetic field generated by the word line thereto.

16. A memory device utilizing giant magnetoresistance effect and comprising:

a substrate with an insulating surface;

a monocrystalline semiconductor layer formed on the insulating surface of said substrate;

N magnetoresistive films (N is an integer equal to or larger than 2) installed on said insulating surface, and extending linearly in a first direction and arranged in parallel to one another in a second direction orthogonal to the first direction, said magnetoresistive films consisting of a first magnetic layer and a second magnetic layer which has a higher coercive force than the first magnetic layer and which is stacked on the first magnetic layer with a non-magnetic layer interposed between them;

M word lines (M is an integer equal to or larger than 2) installed near said magnetoresistive films, separated by an insulating layer, and extending linearly in the second direction and arranged in parallel to one another in the first direction; N first switching elements formed at least on part of said monocrystalline semiconductor layer and electrically connected, respectively, to said N magnetoresistive films; and M second switching elements formed at least on part of said monocrystalline semiconductor layer and electrically connected, respectively, to said M word lines.

17. A memory device utilizing giant magnetoresistance effect and comprising:

a substrate with an insulating surface;

a monocrystalline semiconductor layer formed on the insulating surface of said substrate;

memory cells consisting of magnetoresistive films arranged in an M×N matrix installed on the insulating surface of said substrate (M and N are integers equal to or larger than 2), each of said memory cells consisting of a first magnetic layer and a second magnetic layer which has a higher coercive force than the first magnetic layer and which is stacked on the first magnetic layer with a non-magnetic layer interposed between them;

N sense lines extending linearly in a first direction and arranged in parallel to one another in a second direction orthogonal to the first direction, and electrically connected, respectively, to M memory cells arranged in parallel to one another in the first direction;

M word lines installed near each of said memory cells, separated by an insulating layer, and extending linearly in the second direction and arranged in parallel to one another in the first direction;

N first switching elements formed at least on part of said monocrystalline semiconductor layer and electrically connected, respectively, to said N sense lines; and M second switching elements formed at least on part of said monocrystalline semiconductor layer and electrically connected, respectively, to said M word lines.

18. The memory device according to claim 16 or claim 17, wherein the thickness of said monocrystalline semiconductor layer is in the range of 50 to 500 nm.

19. The memory device according to claim 18, wherein the thickness of said monocrystalline semiconductor layer is in the range of 50 to 250 nm.

20. The memory device according to claim 19, wherein the thickness of said monocrystalline semiconductor layer is in the range of 60 to 120 nm.

21. The memory device according to claim 16 or claim 17, further comprising a buffer layer installed between the insulating surface of said substrate and magnetoresistive films.

22. The memory device according to claim 16 or 17, wherein said word lines are installed between the insulating surface of said substrate and magnetoresistive films.

23. The memory device according to claim 17, wherein said N sense lines are installed between the memory cells in such a way as to tie, respectively, the M memory cells arranged in parallel to one another in the first direction.

24. The memory device according to claim 17, wherein said N sense lines consist of lower sense lines installed between the insulating surface of said substrate and magnetoresistive films, and further comprises M upper sense lines extending linearly in the second direction and arranged in parallel to one another in the first direction, and electrically connected, respectively, to N memory cells arranged in parallel to one another in the second direction, wherein the non-magnetic layer of said magnetoresistive films is made of an insulating material.

25. The memory device according to claim 24, wherein said M word lines are installed on said M upper sense lines, respectively, via an insulating layer.

26. The memory device according to claim 24, wherein the thickness of the film in said lower sense lines are in the range of 1 to 50 nm.

27. The memory device according to claim 26, wherein the thickness of the film in said lower sense lines are in the range of 5 to 20 nm.

28. The memory device according to claim 24, wherein said lower sense lines are formed by impurity doping on part of said monocrystalline semiconductor layer other than the part where the switching elements are formed.

29. The memory device according to claim 16 or claim 17, wherein said substrate with an insulating surface comprises a $SiO_2$ layer formed on the surface of a silicon substrate.

30. The memory device according to claim 29, wherein said monocrystalline semiconductor layer comprises a monocrystalline silicon layer formed on said $SiO_2$ layer.

31. The memory device according to claim 16 or claim 17, wherein each of said first and second switching elements comprises a field-effect transistor comprising a source region, gate region, and drain region.

32. The memory device according to claim 16 or claim 17, further comprising: magnetic-field concentrating layers made of a high-permeability material and installed near said magnetoresistive films to concentrate the magnetic fields generated by the word lines thereto.

* * * * *

UNITED STATES PATENT AND TRADEMARK OFFICE
CERTIFICATE OF CORRECTION

PATENT NO. : 6,055,179
DATED : April 25, 2000
INVENTOR(S) : Akio Koganei et al.

Page 1 of 1

It is certified that error appears in the above-identified patent and that said Letters Patent is hereby corrected as shown below:

Title page,
[73] Assignee: -- Canon Kabushiki Kaisha, Tokyo, Japan --.

Under "ATTORNEY, AGENT OR FIRM" insert:
-- FITZPATRICK, CELLA, HARPER & SCINTO --.

Signed and Sealed this

Twenty-first Day of August, 2001

Attest:

*Nicholas P. Godici*

NICHOLAS P. GODICI
*Attesting Officer*     *Acting Director of the United States Patent and Trademark Office*